United States Patent
Tang

(10) Patent No.: US 10,839,709 B2
(45) Date of Patent: Nov. 17, 2020

(54) DYNAMICALLY EQUIVALENT SIMULATOR FOR VEHICLE ROTATIONAL MOTIONS

(71) Applicant: Shaojie Tang, Sugar Land, TX (US)

(72) Inventor: Shaojie Tang, Sugar Land, TX (US)

(*) Notice: Subject to any disclaimer, the term of this patent is extended or adjusted under 35 U.S.C. 154(b) by 123 days.

(21) Appl. No.: 16/153,925

(22) Filed: Oct. 8, 2018

(65) Prior Publication Data

US 2020/0111381 A1    Apr. 9, 2020

(51) Int. Cl.
| | | |
|---|---|---|
| *G09B 9/14* | (2006.01) | |
| *G09B 9/04* | (2006.01) | |
| *G09B 9/06* | (2006.01) | |
| *G09B 9/042* | (2006.01) | |
| *G09B 9/42* | (2006.01) | |
| *G09B 9/48* | (2006.01) | |
| *G06F 30/15* | (2020.01) | |
| *G06F 30/20* | (2020.01) | |
| *A63G 31/16* | (2006.01) | |

(52) U.S. Cl.
CPC .............. *G09B 9/14* (2013.01); *A63G 31/16* (2013.01); *G06F 30/15* (2020.01); *G06F 30/20* (2020.01); *G09B 9/04* (2013.01); *G09B 9/06* (2013.01); *G09B 9/42* (2013.01); *G09B 9/48* (2013.01)

(58) Field of Classification Search
CPC ... G09B 9/14; G09B 9/04; G09B 9/06; G09B 9/42; G09B 9/12; A63G 31/16
See application file for complete search history.

(56) References Cited

U.S. PATENT DOCUMENTS

| | | | | |
|---|---|---|---|---|
| 3,135,057 A | * | 6/1964 | Nelson | G09B 9/14 434/34 |
| 4,856,771 A | * | 8/1989 | Nelson | A63G 31/16 472/2 |
| 5,702,307 A | * | 12/1997 | Moran | A63G 31/16 472/130 |
| 5,980,256 A | * | 11/1999 | Carmein | A63B 22/02 434/29 |
| 2019/0388795 A1 | * | 12/2019 | Sanchez Animas | G09B 9/02 |

OTHER PUBLICATIONS

Irani et al., A novel Flight Simulator Capable of Unbounded Rotation; published 2017; Dept. of Mechanical and Aerospace Engineering; Carleton Univesity, Ottawa, Ontario K1S 5B6; (Year: 2017).*

* cited by examiner

*Primary Examiner* — Daniel J Colilla

(57) ABSTRACT

A vehicle nonlinear dynamics experimental simulation device, such as flight simulator, including a motorized spherical vehicle suspended inside a spherical shell which has a smooth inner surface. The spherical vehicle is supported by a plurality of spiky legs with bearing assemblies. The spherical shell is supported by three controllable translational motion platforms. Simulating apparatuses for a pilot cabin is mounted inside the spherical vehicle. The spherical vehicle has driving, restoring, and damping capabilities in roll, pitch, and yaw directions and is capable of unbounded rotation in any directions. The spherical vehicle provides an experimental model to simulate a vehicle's rotational dynamics.

10 Claims, 17 Drawing Sheets

DYNAMICALLY EQUIVALENT SIMULATOR FOR VEHICLE ROTATIONAL MOTIONS

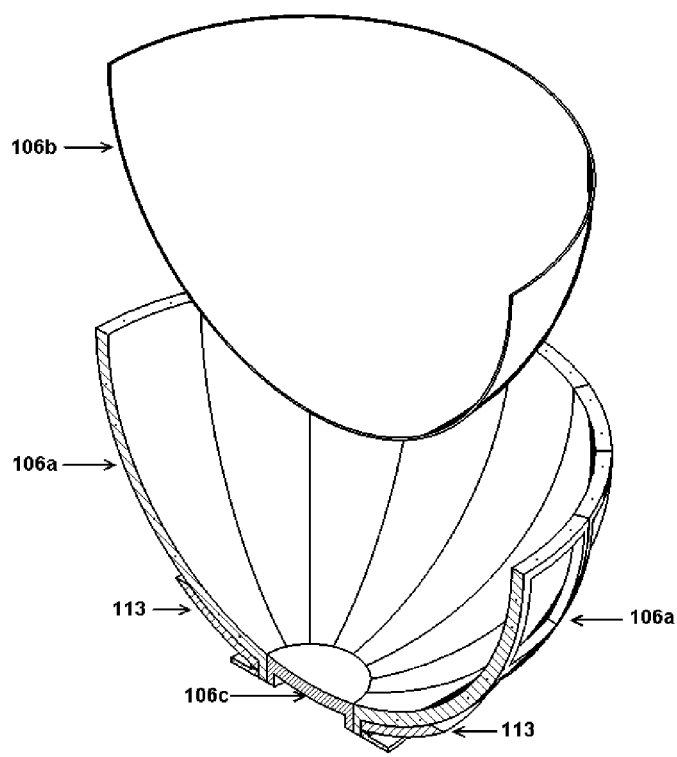
*FIG. 7*
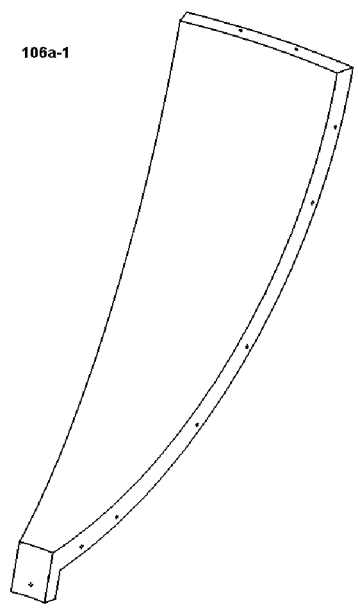  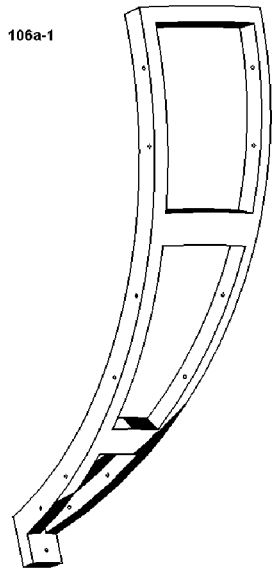
*FIG. 8a*          *FIG. 8b*

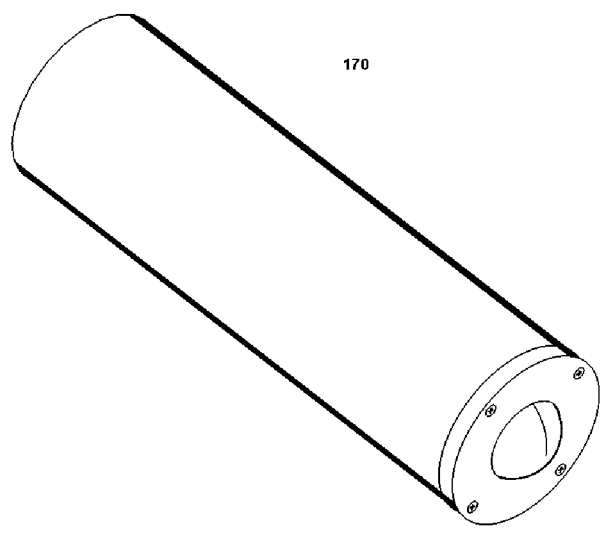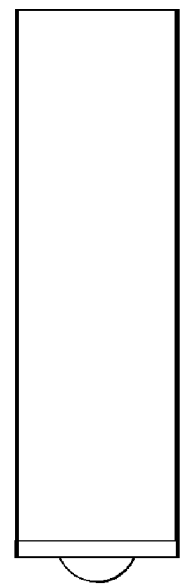
FIG. 26a  FIG. 26b

DYNAMICALLY EQUIVALENT SIMULATOR FOR VEHICLE ROTATIONAL MOTIONS

FIELD OF THE INVENTION

This invention relates to motion simulator, more specifically a suspended spherical vehicle containing one or more occupants. Possible applications includes nonlinear motion simulations for vehicles like aircrafts, automobiles, and ships; testing bed for design and analyses; pilot training; virtual realities; and 3D game playing.

BACKGROUND OF THE INVENTION

Within the aviation and automobile industries, the most extensively used movable training and testing device is known as Stewart Platform, or hexapod platform. Although a flight simulator using hexapod platform is called a full flight simulator since it provides a six-degree-of-freedom, it is actually not a really full six degrees of freedom. The roll, pitch, and yaw are limited in small ranges. For example, the limitations of roll, pitch, and yaw of the KLM 747 motion base given in the Table 1 of "The generation of motion cues on a six-degree-of-freedom motion system" by M. Baarspul, Report LR-248, Delft University of Technology, 1977, were 28% 34% and 36% respectively, not even mention 50% In reality, however, aircrafts could experience much more rotational motions than those limitations. For example, in 1993 Japan Airlines Flight 46E Boeing 747-121 encountered an uncommanded roll of about 50° (see NTSB/AAR-93/06, PB93-910407). A 360° roll was also experienced by TWA Flight 841 in 1979 (see NTSB-AAR-81-8, PB81-910408). Despite the 100 years aviation history, evidence indicates that when faced with uncommanded roll, pitch, and yaw, pilots sometimes have difficulties in quickly responding to the situation which needs rapid action to correct in order to avoid crash. The trainings of uncommanded roll, pitch, and yaw are either not effective enough or not correct at all. The reason for such awkward situation in the industry is that the mechanism of the uncommanded roll, pitch, and yaw has not been understood. The relationship between fidelities of the current flight simulators and real aircrafts is susceptible when the roll, pitch, and yaw motions become large enough since the current flight dynamics are based on the linearization approximation of roll, pitch, and yaw motions, meaning that the aircraft motions have to be small enough to be accurate.

Even with a simulator capable to rotate to 360° in any axis, like the capsules proposed in U.S. Pat. Nos. 5,060,932, 5,490,784, and 6,629,896, the accuracies of the large motions of these capsules are still questionable because first the motions of these capsules are controlled by computer programs which most likely are based on the linearized dynamics and second no real data (like uncommanded roll, pitch, and yaw) available to calibrate the simulated large motions.

As pointed out in the inventor's book, "Nonlinear Instability and Inertial Coupling Effects—The Root Causes Leading to Aircraft crashes, Land Vehicle Rollovers, and Ship Capsizes" (ISBN978-1-7326323-0-1, to be published in November 2018), these uncommanded roll, pitch, and yaw motions experienced by aircrafts are nonlinear phenomena. Without the infinite rotational freedom of three dimensions and the nonlinear flight dynamics, large rotational motions cannot be simulated accurately. The new scientific discovery given in the inventor's book about the nonlinear instability of vehicle dynamics is summarized below. Vehicles like cars, ships, and aircrafts all have rolling problems. Cars have rollover; ships have rolling and capsizing; and aircrafts have Dutch roll and mysterious crashes. Is it just a coincident that all these three major types of vehicles have the same rolling problem? Or it is not. The fact is that all these vehicles follow a same scientific law and show the same symptom. These vehicles have existed for more than a century. It is believed that the rolling problems have, so far, accounted for accidents and deaths in the level of millions and the cost of injuries in medical care, disability and property damage in trillions of dollars worldwide. This invention is one of several inventions the inventor has invented to deal with those dangerous rolling phenomena in order to save lives on the roads and oceans, and in the sky around the world by applying the new scientific discovery.

From the viewpoint of physics, these vehicles are nothing but rigid body systems of six degrees of freedom (three translational motions in three perpendicular axes, i.e. forward/backward, left/right, up/down; and three rotational motions about three orthogonal axes, often termed roll, pitch, and yaw). Believe it or not, the three rotational (roll, pitch, and yaw) motions under external moments have never been solved analytically without linearization approximation and as a result they have never been understood satisfactorily due to the fact that the governing equations for these motions are nonlinear which was extremely difficult to deal with analytically. Although numerical simulations for those motions have been obtained, the results were often difficult to be explained because of the lack of the correct understanding of the mechanism. Consequently, there have been so many SUV rollovers, airplane crashes, and ship capsizes, which were hard to be explained and have remained mysteries. For example, why some vehicles had many times more rollover fatality rate than other vehicles with the same rollover rating, i.e. Static Stability Factor (SSF). The mysterious airplane crashes include United Airlines Flight 585 in 1991, SilkAir Flight 185 in 1997, EgyptAir Flight 990 in 1999, and American Airlines Flight 587 in 2001 to name a few. Ship broaching and capsizing in severe following seas has not been explained satisfactorily as well.

A fundamental mistake has been made in dealing with the vehicle dynamics in the current academic and industry practices. For a vehicle, no matter it is a car, or an aircraft, the governing equations for its rotational motions (roll, pitch, and yaw) are given by Math. 1 in the vector form. They were obtained based on Newton's second law of motions in the body-fixed reference frame, $$d\vec{H}/dt = -\vec{\omega} \times \vec{H} + \vec{M}, \qquad \text{Math. 1}$$

wherein $\vec{\omega} = (p, q, r) = (\dot{\varphi}, \dot{\theta}, \dot{\psi})$: the angular velocities of the vehicle; $\varphi$, $\theta$, $\psi$: the roll, pitch, and yaw angle about the principal axes of inertias X, Y, Z, respectively; $\vec{H} = (I_x p, I_y q, I_z r)$: the angular momentum of the vehicle; $I_x$, $I_y$, $I_z$: the moment of inertias about the principal axes of inertias X, Y, Z, respectively (These parameters are constants in this frame); $\vec{M} = (M_x, M_y, M_z)$: the external moments acting on the vehicles about the principal axes of inertia. In both the academies and industries related to automobiles, aircrafts, and ships, the current practice to deal with Math. 1 is to make a linearization approximation first and then solve the equations because the nonlinear term $-\vec{\omega} \times \vec{H}$ is too difficult to deal with. The linearization approximation makes the nonlinear term $-\vec{\omega} \times \vec{H}$ disappear, the equations then become $$d\vec{H}/dt = \vec{M}. \qquad \text{Math. 2}$$

However, the equations are still considered in the body-fixed reference frame which is a non-inertial frame. The reason for this is that the external moments ($M_x$, $M_y$, $M_z$) acting on vehicles and the moments of inertia $I_x$, $I_y$, $I_z$ are needed to be considered in the body-fixed reference frame.

The fundamental mistake is that the nonlinear term $-\vec{\omega} \times \vec{H}$ cannot be neglected because they are the inertial moments tied to the non-inertial reference frame which is the body-fixed reference frame in this case. This mistake is similarly like we neglect the Coriolis force which equals $-2\vec{\Omega} \times \vec{V}$, where $\vec{\Omega}$ is the angular velocity vector of the earth and $\vec{V}$ is the velocity vector of a moving body on earth. Then we try to explain the swirling water draining phenomenon in a bathtub. In this case, we are considering the water moving in the body-fixed and non-inertial reference frame which is the earth. The Coriolis force is an inertial force generated by the rotating earth on the moving objects which are the water particles in this case. Without the Coriolis force, we cannot explain the motions of the swirling water. Similarly in the vehicle dynamics, the vehicle is rotating, and we consider the rotational motions of the vehicle in the body-fixed and non-inertial reference frame which is the vehicle itself. The difference between the two cases is that in the former the object (water particle) has translational motions ($\vec{V}$) while in the latter the object (vehicle itself) has rotational motions ($\vec{\omega}$) but they both have the important inertial effects which cannot be neglected because both the objects are considered in the non-inertial reference frames. In the former the inertial effect is the Coriolis force $-2\vec{\Omega} \times \vec{V}$ while in the latter the inertial effect is the inertial moment $-\vec{\omega} \times \vec{H}$ which are not forces but moments since we are dealing with rational motions instead of translational one. Without the inertial moment, we cannot explain many phenomena which happened to aircrafts, automobiles, and ships, such as uncommanded motions of roll, pitch, and yaw for aircrafts; Pilot-Induced-Oscillation (PIO) for aircrafts; automobile rollovers; and ship capsizes.

In the inventor's book, the equations Math. 1 have been solved analytically without the linearization approximation and it was found that the pitch motion, without loss of generality assuming the pitch moment of inertia to be the intermediate between the roll and yaw inertias, is conditionally stable and becomes unstable in certain circumstances. A brief summary of the findings is given below. The governing equations of rotational motions of an aircraft or an automobile under a periodic external pitch moment can be written in scalar form as $$I_x \ddot{\varphi} + b_1 \dot{\varphi} + k_1 \varphi = (I_y - I_z)\dot{\theta}\dot{\psi}, \qquad \text{Math. 3}$$

$$I_y \ddot{\theta} + b_2 \dot{\theta} + k_2 \theta = (I_z - I_x)\dot{\varphi}\dot{\psi} + M_{21} \cos(\omega_{21} t + \alpha_{21}), \qquad \text{Math. 4}$$

$$I_z \ddot{\psi} + b_3 \dot{\psi} + k_3 \psi = (I_x - I_y)\dot{\varphi}\dot{\theta}, \qquad \text{Math. 5}$$

wherein $b_1$, $b_2$, $b_3$ are the damping coefficients for roll, pitch, and yaw, respectively; $k_1$, $k_2$, $k_3$ are the restoring coefficients for roll, pitch, and yaw, respectively; $M_{21}$ is the external pitch moment amplitude; $\omega_{21}$ and $\alpha_{21}$ are the frequency and phase of the external pitch moment, respectively. These equations represent a dynamic system governing the rotational dynamics of vehicles, such as an aircraft when taking off or approaching to landing or an automobile when running off the curb where the most fatal rollovers happen. According to the current practice in the industries under the linearization approximation, these equations become $$I_x \ddot{\varphi} + b_1 \dot{\varphi} + k_1 \varphi = 0 \qquad \text{Math. 6}$$

$$I_y \ddot{\theta} + b_2 \dot{\theta} + k_2 \theta = M_{21} \cos(\omega_{21} t + \alpha_{21}), \qquad \text{Math. 7}$$

$$I_z \ddot{\psi} + b_3 \dot{\psi} + k_3 \psi = 0, \qquad \text{Math. 8}$$

Therefore the current practice says that the vehicle will only have pitch motion, no roll and yaw motions because there are no moments acting on roll and yaw directions. In reality, however, there exist moments acting in roll and yaw directions as indicated by the nonlinear terms in the right hand sides of Math. 3 and Math. 5, respectively. These moments are the components of the inertial moment vector $-\vec{\omega} \times \vec{H}$ along roll and yaw directions, respectively, and they are real and must not be neglected. The linearization theory assumes that these nonlinear terms are small so that they can be neglected. The fact is that this assumption is not always valid. The reason is explained below. The roll and yaw dynamic systems of vehicles are harmonic oscillation systems as shown in Math. 3 and Math. 5. As we know for a harmonic system, a resonance phenomenon can be excited by a driving mechanism no matter how small it is as long as its frequency matches the natural frequency of the system. It was found in the inventor's book mentioned above that under certain circumstances the nonlinear terms, $(I_y - I_z)\dot{\theta}\dot{\psi}$ and $(I_x - I_y)\dot{\varphi}\dot{\theta}$ can simultaneously excite roll and yaw resonances, respectively. In these cases, the pitch motion becomes unstable and the roll and yaw motions grow exponentially at the same time under the following two conditions, Math. 9 and Math. 10. Such nonlinear instability is a phenomenon of double resonances, i.e. roll resonance in addition to yaw resonance.

$$A_P > A_{P-TH} = \frac{1}{\omega_{21}} \sqrt{\frac{b_1 b_3}{(I_z - I_y)(I_y - I_x)}} \text{ and } \omega_{21} = \omega_{10} + \omega_{30}, \qquad \text{Math. 9}$$

$$A_P > A_{P-TH} = \frac{1}{\omega_{21}} \sqrt{\frac{b_1 b_3}{(I_z - I_y)(I_y - I_x)}} \text{ and } \omega_{21} = |\omega_{10} + \omega_{30}|, \qquad \text{Math. 10}$$

wherein $A_p$ is the pitch response amplitude under the external pitch moment $M_{21} \cos(\omega_{21} t + \alpha_{21})$; $\omega_{10} = \sqrt{k_1/I_x}$ and $\omega_{30} = \sqrt{k_3/I_z}$ are the roll and yaw natural frequencies, respectively. The nonlinear dynamics says that the pitch motion is stable until the pitch motion reaches the threshold values $A_{P-TH}$ given in Math. 9 or Math. 10. These threshold values show that the vehicle has two dangerous exciting frequencies in pitch. These two frequencies are either the addition of the roll natural frequency $\omega_{10}$ and the yaw natural frequency $\omega_{30}$ or the subtraction of them. At each frequency, the pitch amplitude threshold for pitch to become unstable is inversely proportional to the pitch exciting frequency, proportional to the square root of the product of the roll and yaw damping coefficients, and inversely proportional to the square root of the product of the difference between the yaw and pitch moments of inertia and the difference between the pitch and roll moments of inertia. In summary, there are three factors having effects on the pitch threshold and they are a) the roll and yaw damping, b) the pitch exciting frequency, and c) the distribution of moments of inertia. The most dominant one among these three factors is the damping effect since the damping coefficients could go to zero in certain circumstances, for example, aircraft yaw damper malfunction which makes the yaw damping become zero, or aircraft in stall condition which makes the roll damping become zero. When either the roll damping or the yaw damping is approaching to zero, the pitch threshold is approaching to zero as well and the pitch motion, even it is small but as long as larger than the threshold value, will become unstable and transfer energy to excite roll and yaw resonances. That is the root mechanism behind all these mysterious tragedies mentioned above. In the inventor's book detailed scientific proofs based on analytical, numerical, and experimental results have been given. Many real case analyses, like aircraft crashes and SUV rollovers, have been given as well. The inventor's another patent application U.S. Pat. No. 16,153,883 is related to an apparatus used as a demonstrator in the book to demonstrate the phenomenon of nonlinear pitch instability.

Therefore there is a need for a motion simulator which can provide a test bed, first to be capable to show the nonlinear instability, second to be used for training pilots or vehicle operators on how to avoid this nonlinear instability and how to recover from this instability if they got into that situation in the first place, third to provide nonlinear (larger) motion data for calibrating a passive-motion simulators, and last to test and analyze the nonlinear dynamics of new designs of vehicles, such as aircrafts, automobiles, and ships.

SUMMARY OF THE INVENTION

The principal objective of the present invention is to provide a mechanical simulator to be used to perform nonlinear vehicle dynamics and to be used for training, simulation purposes, control analyses, and designs of vehicles which include, but not limited to, aircrafts, automobiles, and ships. The present invention allows a user to create a mechanical simulator having rigid body rotational dynamics equivalent with that of a full scale vehicle to be simulated and provide a test bed to perform fully nonlinear rotational dynamic simulations for vehicles, such as aircrafts, automobiles, and ships etc. The most critical applications of this invention include simulations of unconventional phenomena and evaluations of unconventional designs for which no experience base exists for such conditions including flight at high angles of attack, stall, and spins for aircrafts. In these conditions large dynamic motions are typically encountered.

In one embodiment, the present invention includes a motorized spherical vehicle suspended inside a spherical shell by a plurality of air bearing supports so that the spherical vehicle has infinite degrees of rotational freedom in roll, pitch, and yaw directions. The air bearing supports are mounted outside of the spherical vehicle in a distribution pattern and diametrically opposed in pairs such that the spherical vehicle weight is always supported by a plurality of air bearings at all times during rotational motions. The spherical shell has a smooth inner surface to allow the air bearings to work efficiently to support the spherical vehicle to rotate easily and smoothly. Six drive assemblies on the spherical vehicle are responsible to drive the spherical vehicle in rotational movements in roll, pitch, and yaw directions. Six restoring and damping assemblies on the spherical vehicle are responsible to apply restoring moments and damping moments in roll, pitch, and yaw directions. The moments of inertias, the restoring coefficients and the damping coefficients in roll, pitch, and yaw directions of the spherical vehicle are to be tuned and designed to be scaled down at a predetermined ratio comparing with that of the real vehicle to be simulated, and similarly the driving moments along roll, pitch, and yaw directions are also scaled down at the same ratio. The spherical shell is supported by three controllable translational motion platforms. Simulating apparatuses for a pilot cabin are mounted inside the spherical vehicle. In this invention, the translational movements (surge, sway, and heave) of the spherical vehicle are passive and controlled by a simulating computer. However, the rotational movements (roll, pitch, and yaw) of the spherical vehicle as a rigid body are ACTIVE and controlled by the control inputs and also by the nonlinear dynamics of the rigid body itself, in contrast to the PASSIVE movements of the simulation platforms controlled totally by computers commonly used in the current industry practices.

The spherical shell includes a bottom dome structure and a top dome structure with the same size. Each of the dome structures includes at least two layers. The outer layer includes a plurality of identical frame panels. Preferably, these panels are to be made of fiber-reinforced composite materials to provide enough strength to support the weight of the spherical vehicle. The outer layer panel has a smooth inner surface and outside skeletal frames. These panels are fastened together by bolts through the frames to form a half sphere dome. The inner layer includes a thin, hard, and air-tight half sphere dome layer with an extremely smooth inner surface. Preferably, the inner layer is seamless except at the door frame in the top dome and at the location where the top and bottom domes meet. The inner layer is bonded with the outer layer to form a solid half sphere dome. The top half sphere dome is fastened with the bottom half sphere dome by bolts through the frames in the great circles of the two domes to form a solid spherical shell. On the top half sphere dome, there is a purposely build door capable to be open and closed tight from the outside to allow people to get in and out of the spherical vehicle. A door frame is a cut-out from one of the bottom panel of the top sphere dome. The door is made similarly and with the same material as the spherical shell with additional reinforced frames bonded on the outside surface of the door and has a same smooth, air-tight and spherical shape inner surface. When the door is closed a perfect air-tight spherical shell is formed. The translational motions (surge, sway, and heave) of the spherical shell may be remotely controlled by computers on-board the spherical vehicle or controlled by computers located outside of the spherical shell with communication means to the spherical vehicle.

The spherical vehicle includes a spherical skeleton made of ring beams, a plurality of the air bearing support assemblies, a plurality of the drive assemblies, a plurality of the restoring and damping assemblies, a platform, a pilot cabin, and control apparatuses such as batteries, air compressors, computers, screens, etc. Preferably, these ring beams are made of fiber-reinforced composite materials or light metal such as aluminum to provide strong bending strength and light weight. The radiuses of all the ring beams are same and designed based on a cube as shown in FIG. 13a. There are nine ring beams in the example. Three ring beams are located on the XOY, YOZ, and XOZ planes, respectively. The orientations of the other six ring beams may be found by rotating the above three ring beams ±45° about X, Y, and Z axes, respectively. The nine ring beams are connected with each other to form a solid spherical skeleton as a base truss for the spherical vehicle as shown in FIG. 13b. The nine ring beams contact all the 14 vertices of a tetrakis hexahedron (not shown) formed based on the inside cube shown in FIG.

13a. The tetrakis hexahedron may be imagined as the inside cube with pyramids on each face. The apex of each pyramid coincides with the centers of the four-ring-beam joints (FIG. 13d) which are also located on X, Y, and Z axes as shown in FIG. 13a.

Each of the air bearing assemblies includes a support post, a ball connector and a spherical convex air bearing. The air bearing assemblies are radially outward mounted on the ring beams which construct the skeleton for the spherical vehicle. Preferably, the air bearing are located at the locations of the 14 vertices of the tetrakis hexahedron mentioned above. The air bearing is made of porous materials and has a convex spherical curvature substantially matching that of the inner surface of the spherical shell. High pressure air from on-board air compressors is supplied to the air bearings to form a thin layer of air to allow frictionless motions for the spherical vehicle.

The driving assemblies include six omni wheel units driven by reversible DC motors with variable speed. Preferably each driving omni wheel unit includes one pair of identical driving omni wheels. Each two of those identical driving omni wheel units are mounted outside of the spherical vehicle along a great circle in a diametrically opposed fashion. The six driving omni wheel units are mounted on three great circles which are orthogonal to each other and the normal directions of the three great circles coincide with the directions of roll, pitch, and yaw, respectively. Each driving omni wheel unit is controlled by a linear actuator to be operable to contact and detach the inner surface of the spherical shell in order to apply a desired moment on the spherical vehicle in a fixed direction relative to the spherical vehicle body-fixed reference frame. The omni wheels are specially designed to have continuous alternate rollers (e.g. German patent DE822660) to allow smooth movements for the spherical vehicle.

The restoring and damping assemblies include six omni wheel units driven by rotational springs and rotational dampers. Preferably each restoring omni wheel unit includes one pair of identical restoring omni wheels. Similarly, each two of those identical restoring omni wheel units are mounted outside of the spherical vehicle along a great circle in a diametrically opposed fashion and radially symmetrical with the driving omni wheel units. So the six restoring omni wheel units are also mounted on three great circles which are orthogonal to each other and the normal directions of the three great circles coincide with the directions of roll, pitch, and yaw, respectively. Each restoring and damping omni wheel unit is controlled by a linear actuator to be operable to contact the inner surface of the spherical shell at all times in order to apply restoring and damping moments on the spherical vehicle in a fixed direction relative to the spherical vehicle body-fixed reference frame. Each restoring omni wheel unit is connected with one rotational spring and one rotational damper. Preferably, the rotational springs are machined springs to provide precise deflection rates. Each rotational damper is connectable to a shaft of the restoring omni wheels by a mechanism similar to an automobile transmission so that the damping effects are capable to be shifted among different levels during operation just like changing gears in automobiles. The shift of the rotational damper is controlled by a linear actuator mounted on the external surface of the casing of the restoring and damping assembly.

In another embodiment, the air bearing assemblies in this invention may be replaced by ball wheel assemblies with a comparable size. Therefore in this case, the on-board air compressors are not necessary, and the spherical vehicle weight may be decreased. Comparing with the frictionless environment provided by the air bearings, the ball wheel assemblies introduce certain friction damping into this rotational system, i.e. the spherical vehicle.

BRIEF DESCRIPTION OF THE DRAWINGS

The following descriptions of drawings of the preferred embodiments are merely exemplary in nature and are not intended to limit the scope of the invention, its applications, or uses in anyway.

FIG. 7 is an exploded view of the spherical shell shown in FIG. 6.

FIG. 8a and FIG. 8b are perspective views at different angles for a supporting structure panel of the spherical shell.

FIG. 21a is a perspective inside view of the restoring and damping assembly shown in FIG. 18 and FIG. 19a.

FIG. 26a is a perspective view of a ball wheel assembly which may be used to replace the air bearing assembly shown in FIG. 14. FIG. 26b is a side view of the ball wheel assembly.

DETAILED DESCRIPTION OF THE EMBODIMENTS

Figure 1:
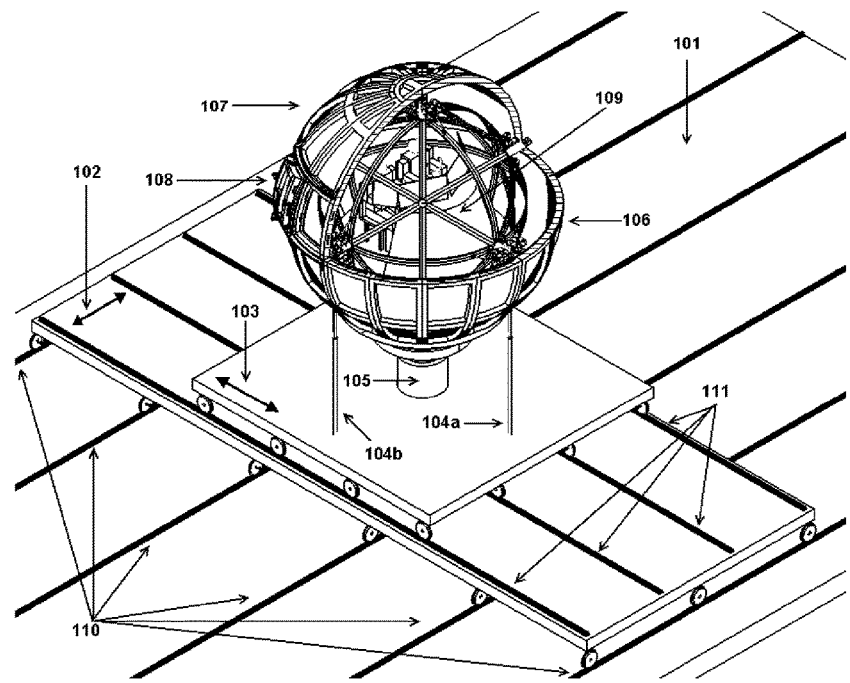
FIG. 1 is a perspective view of the nonlinear vehicle dynamically equivalent simulator with a quarter portion cut-out of the spherical shell to allow a view of the inside structures of the simulator.
Figure 2:
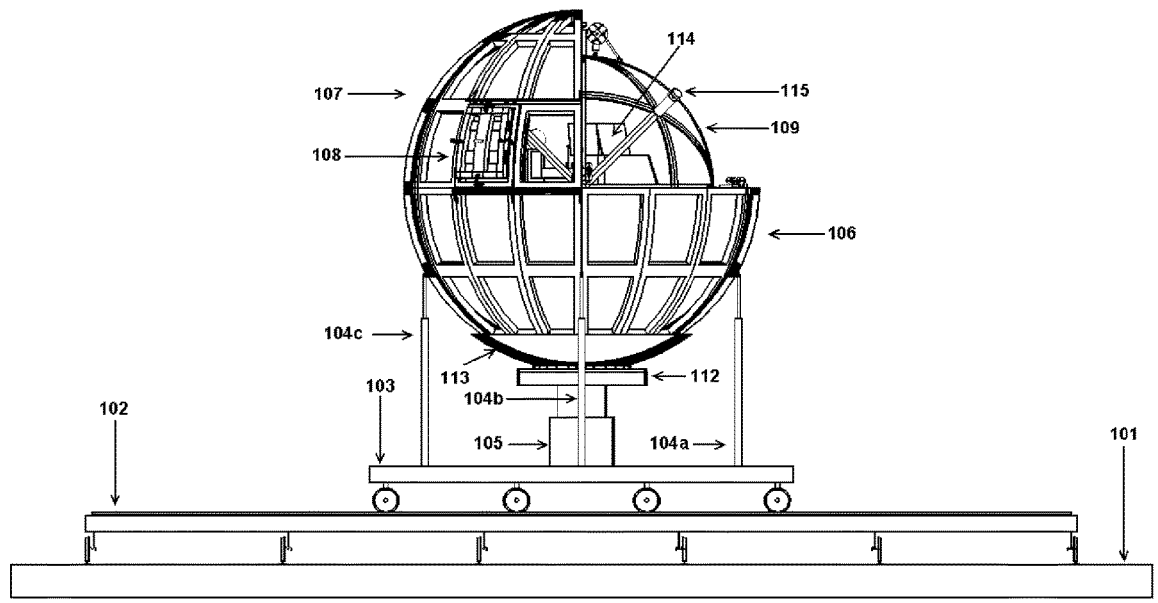
FIG. 2 is a side view of the simulator shown in FIG. 1.
Figure 3:
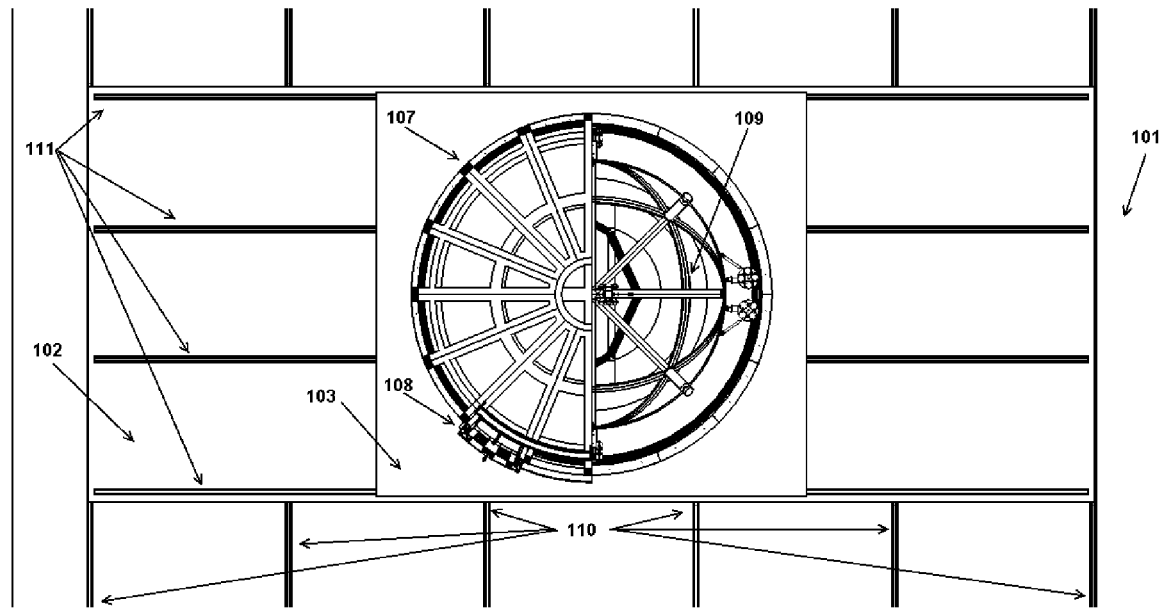
FIG. 3 is a top view of the simulator shown in FIG. 1.
Figure 4:
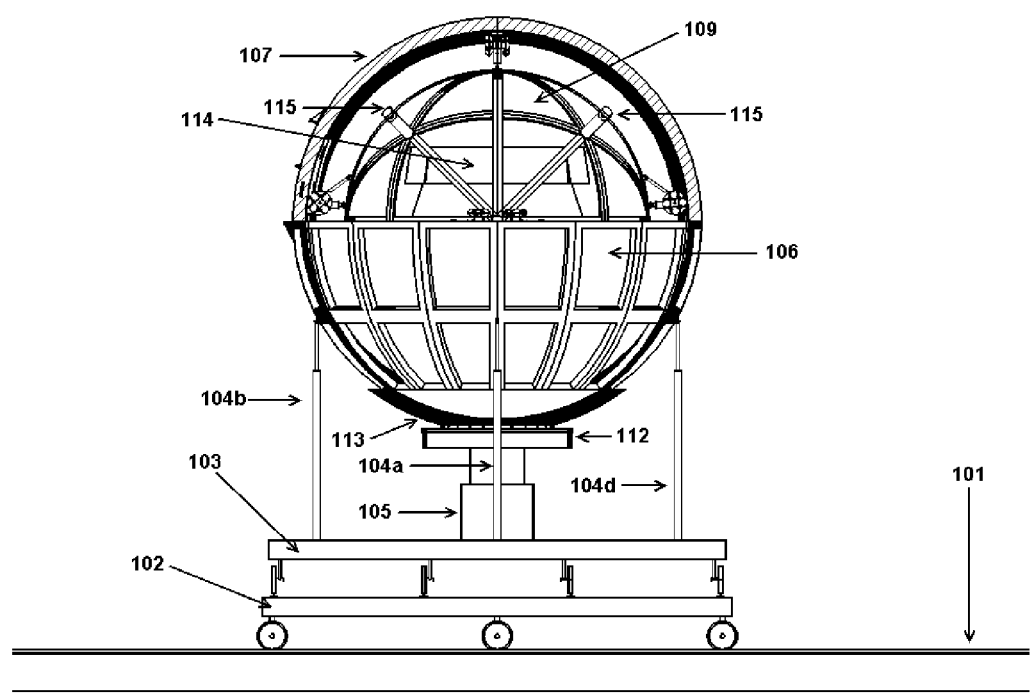
FIG. 4 is a front view of the simulator shown in FIG. 1.

The underlying idea of the present invention is to provide a simulator, as shown in FIG. 1, which can be used to do experimental simulations for vehicle nonlinear dynamics. A spherical vehicle 109 is suspended inside a spherical shell made of a top half shell 107 and a bottom half shell 106. The spherical shell is supported by a vertically movable hydraulic piston 105 and four linear actuators 104a, 104b, 104c (FIG. 2) and 104d (FIG. 4). The piston 105 is mounted on top and in the center of a horizontal movable platform 103 which has a plurality of wheels at its bottom. These wheels are movable along a plurality of rails 111 and driven by electrical motors (not shown) controlled by a control system of the simulator. These rails 111 are parallel and mounted equally spaced on top of a platform 102 which is larger than the platform 103 and has a plurality of wheels at its bottom. These wheels are movable along a plurality of rails 110 and driven by electrical motors (not shown) controlled by the control system of the simulator. These rails 110 are parallel and mounted equally spaced on top of a platform 101 which is larger than the platform 102. The orientations of the rails 111 and the rails 110 are orthogonal. Therefore, three translational motions, i.e. surge, sway, and heave are provided by the platforms 103, the platform 102, and the piston 105, respectively. On the top half shell 107, there is a sliding door assembly 108 capable to be opened from outside of the spherical shell to let people in and out of the spherical vehicle 109. FIG. 2 is a side view of the simulator shown in FIG. 1 with the door open showing a pilot cabin. A vertical movable supporting platform includes the piston 105, a round platform 112, and a bowl-like supporting structure 113. A set of screen 114 may be used for showing the virtual reality view of simulations. The platform 101 is on a flat ground of a room which is housing the simulator. FIG. 3 and FIG. 4 are a top view and a front view of the simulator, respectively, showing detailed layouts. A plurality of air bearing assemblies 115, shown in FIG. 2 and FIG. 4, are mounted on ring beams of the spherical vehicle 109.

Figure 5:
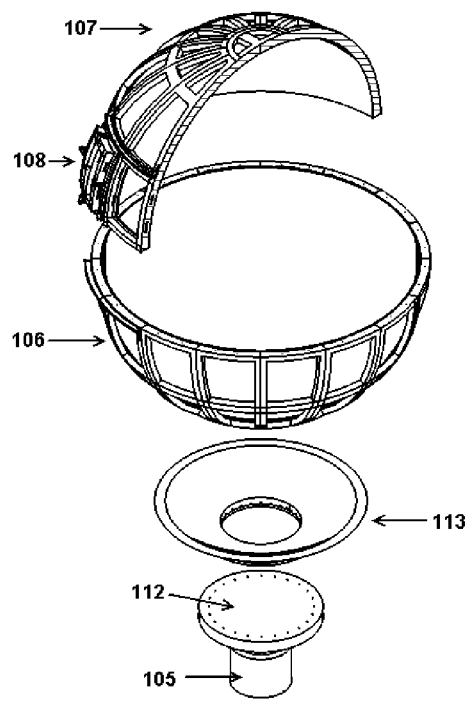
FIG. 5 is an exploded view of the spherical shell and the supporting hydraulic platform with controllable vertical motion capability.
Figure 6:
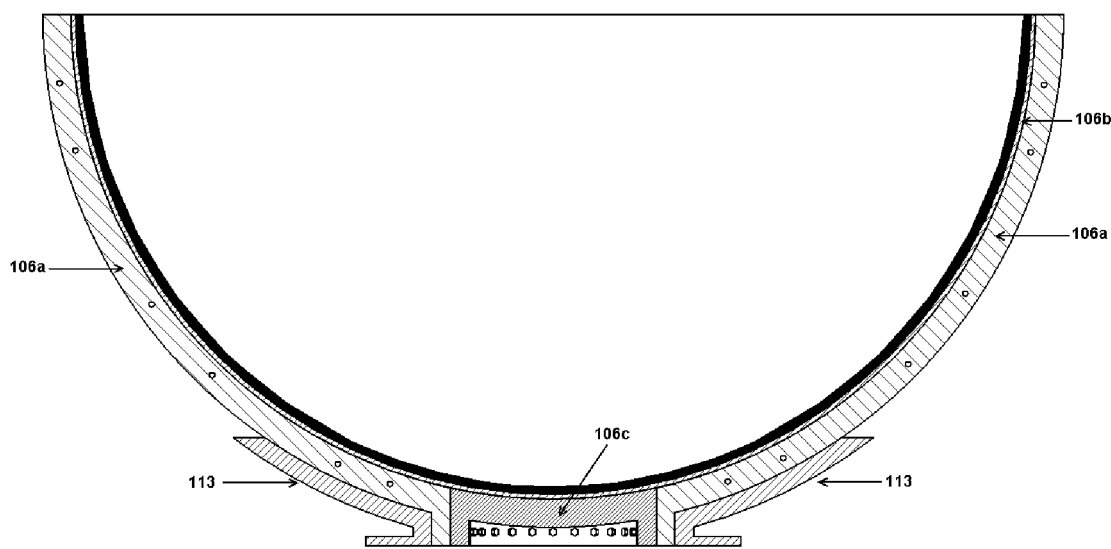
FIG. 6 is a section view of the spherical shell and its supporting structure.

Detailed layouts of the spherical shell and its supporting structures are given in FIG. 5, FIG. 6, FIG. 7, FIG. 8a and FIG. 8b. The bottom half spherical shell 106 shown in FIG. 5 includes an outer layer 106a, a round apex outer layer 106c, and an inner seamless thin shell layer of half sphere 106b as shown in FIG. 6. The outer layer 106a includes 16 identical panels each of which looks like panel 106a-1 shown in FIG. 8a and FIG. 8b. These 16 panels are fastened together by bolts through outside frames of the panels as shown in FIG. 8a and FIG. 8b and also fasten together with the round apex outer layer 106c by a plurality of bolts to form a solid bottom half spherical shell (106a and 106c). Preferably, the outer layer panels are made of fiber-reinforced composite materials or the like to provide light weight and enough strength to support the inner thin layer 106b and in turn to support weights of the spherical vehicle, and the inner thin layer 106b is to be made of airtight and hard materials such as fiber-reinforced composite materials or the like, or even metals like aluminum or stainless steel if necessary. The top half spherical shell 107 has similar structures as the bottom half spherical shell 106. The bowl-like supporting structure 113 as shown in FIG. 5, FIG. 6, and FIG. 7 is mounted on the platform 112 by a plurality of vertical screws. The outer layer 106a, the round apex outer layer 106c, and the bowl-like supporting structure 113 are fastened together by a plurality of horizontal bolts as shown in FIG. 6. The half sphere seamless thin layer 106b is bonded with the half outer layer spherical shell (106a and 106c) as shown in FIG. 7 to form the solid half spherical shell 106. The top half spherical shell 107 has a similar structure as the bottom shell 106 and joints 106 by bolts through frames along the great circle as shown by FIG. 5 to form a complete solid spherical shell which has an airtight and extremely smooth inner surface.

Figure 9:
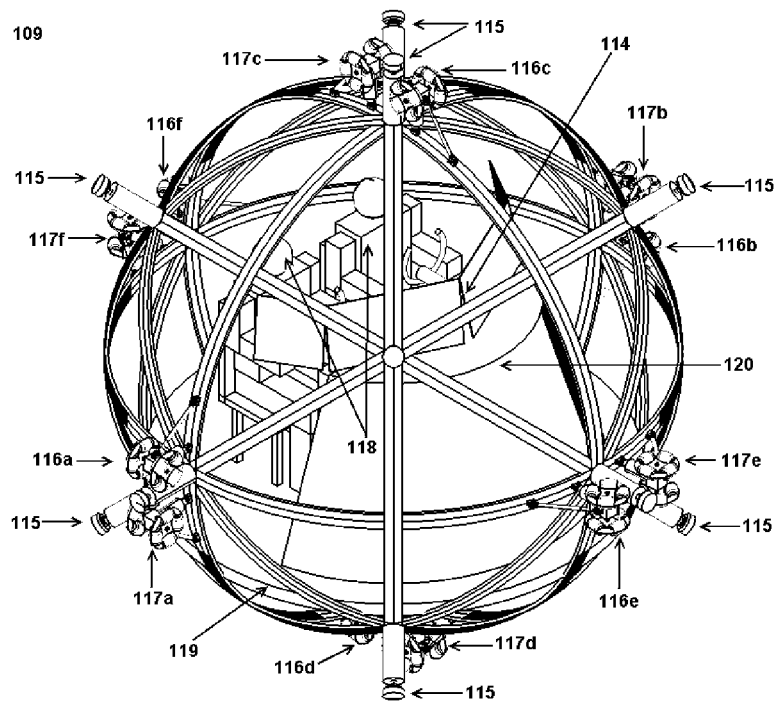
FIG. 9 is a perspective view of the spherical skeleton with spike-type supports.
Figure 10:
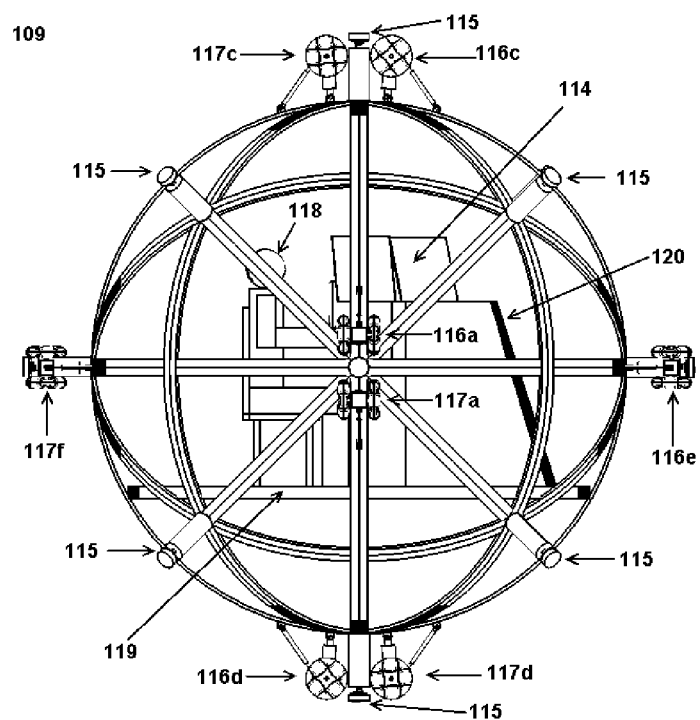
FIG. 10 is a side view of the spherical skeleton shown in FIG. 9.
Figure 11:
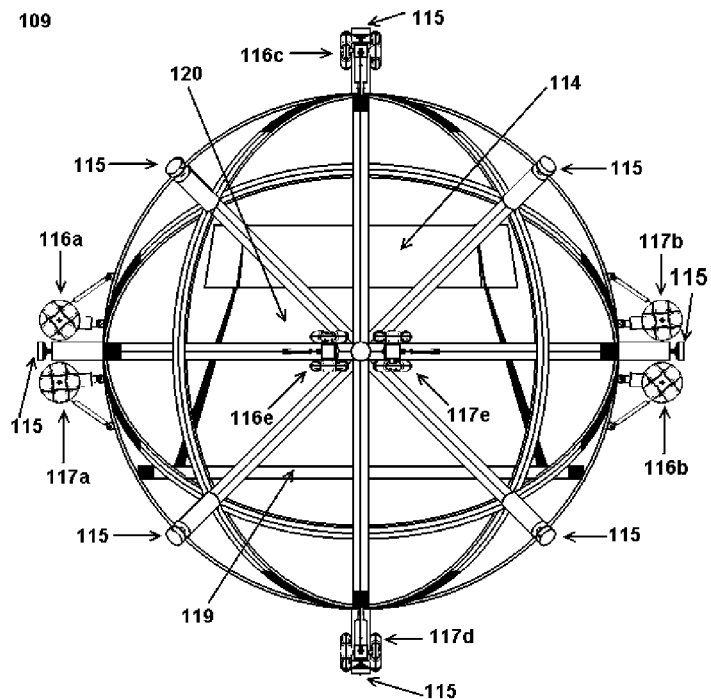
FIG. 11 is a front view of the spherical skeleton shown in FIG. 9.
Figure 12:
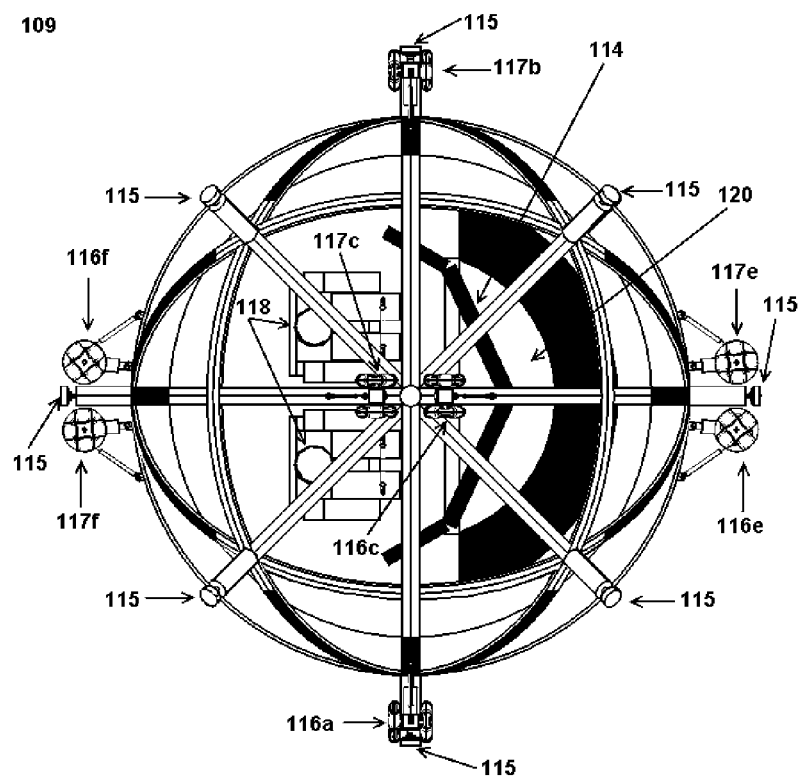
FIG. 12 is a top view of the spherical skeleton shown in FIG. 9.
Figure 13A:
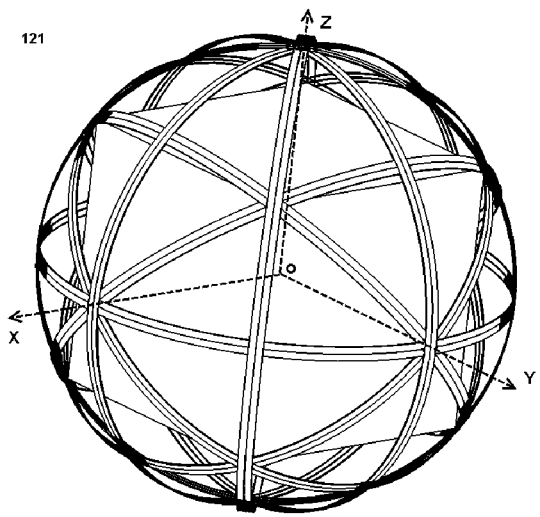
FIG. 13a is a perspective view of the spherical skeleton structure with a reference cube inside the skeleton.
Figure 13B:
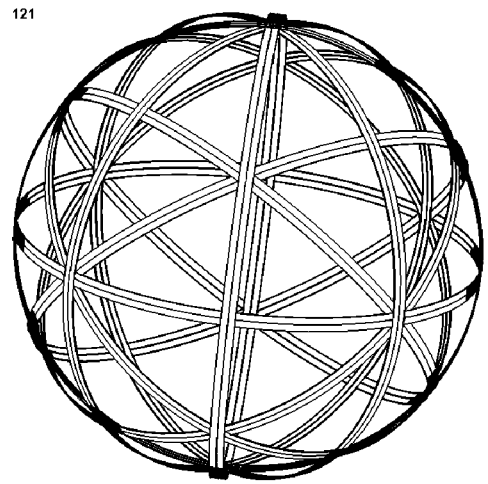
FIG. 13b is a perspective view of the spherical skeleton without the reference cube.
Figure 13C:
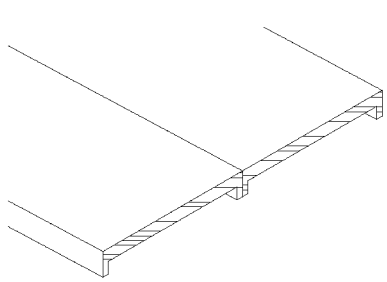
FIG. 13c is a perspective section view of a typical frame constructing the spherical skeleton.
Figure 13D:
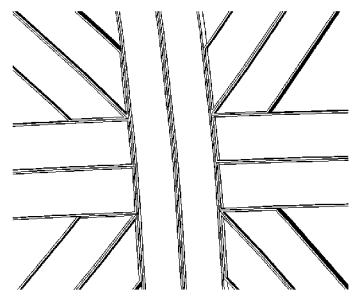
FIG. 13d is a rear view of a typical four-frame joint of the spherical skeleton.
Figure 13E:
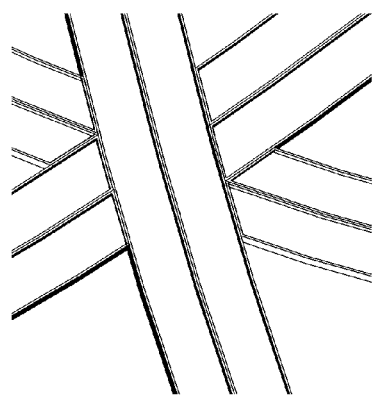
FIG. 13e is a rear view of a typical three-frame joint of the spherical skeleton.
Figure 14:
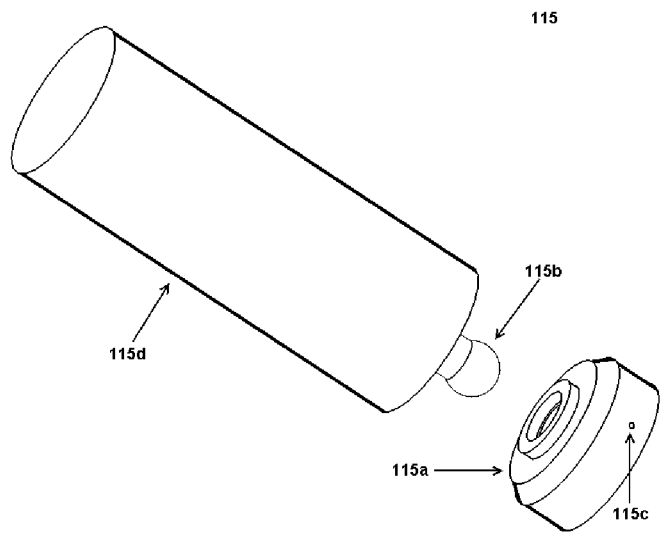
FIG. 14 is an exploded view of a spike-type support of an air bearing assembly.

Referring to FIG. 9, FIG. 10, FIG. 11, FIG. 12, FIG. 13a, FIG. 13b, FIG. 13c, FIG. 13d, and FIG. 13e, the spherical vehicle 109 includes a spherical skeleton 121 shown in FIG. 13a and FIG. 13b, 14 air bearing assemblies 115 (FIG. 9 and FIG. 10), six drive assemblies 117a, 117b, 117c, 117d, 117e, and 117f (FIG. 9), six restoring and damping assemblies 116a, 116b, 116c, 116d, 116e, and 116f (FIG. 9), a pilot cabin support platform 119, pilot models 118, a dashboard 120, and the screens 114 as shown in FIG. 9 and FIG. 10. The spherical vehicle also contains all necessary apparatuses (not shown) for suspending the spherical vehicle, controlling, and operating the vehicle such as air compressors, batteries, computers, even oxygen tanks (if necessary) and etc. The spherical skeleton 121 (FIG. 13a and FIG. 13b) includes a plurality of ring beams. There are nine ring beams in the example (FIG. 13a and FIG. 13b). Preferably, these ring beams are made of fiber-reinforced composite materials or light metal such as aluminum to provide strong bending strength and light weight. Radiuses of all the ring beams are same. All these ring beams are within the circumscribing sphere of a tetrakis hexahedron based on an inside cube shown in FIG. 13a. The tetrakis hexahedron may be imagined as the inside cube with pyramids on each face. An apex of each pyramid coincides with the center of a four-ring-beam joint (FIG. 13d). There are 6 such four-ring-beam joints which are also located on X, Y, and Z axes as shown in FIG. 13a. Three ring beams are located on the XOY, YOZ, and XOZ planes, respectively, as shown in FIG. 13a. The orientations of the other six ring beams may be found by rotating the above three ring beams ±45° about X, Y, and Z axes, respectively. Each ring beam includes two sub-ring beams with U-type cross sections as shown in FIG. 13c. The two sub-ring beams are bonded together side by side to form a solid ring beam in order to provide more bending strength in the middle line as shown in FIG. 13c. The nine ring beams are connected with each other to form the solid spherical skeleton 121 as a base truss for the spherical vehicle as shown in FIG. 13b. FIG. 13d is an underneath view showing a typical joint of four ring beams. FIG. 13e is an underneath view showing a typical joint of three ring beams.

Referring to FIG. 14, each of the air bearing assemblies 115 includes a support post 115d, a ball connector 115b, and a convex spherical air bearing 115a with an air inlet 115c. The air bearing assemblies are mounted radially outward on the ring beams which construct the skeleton for the spherical vehicle. Preferably, there are 14 identical air bearing assemblies as shown in FIG. 9, FIG. 10, FIG. 11, and FIG. 12. These air bearings are located at the locations of the 14 vertices of the tetrakis hexahedron (not shown) mentioned above. Each air bearing is made of porous materials and has a convex spherical curved surface which matches that of the inner surface of the spherical shell. High pressure air from on-board air compressors (not shown) is supplied through a hose (not shown) connecting to the air inlet 115c into the air bearing 115a to form a thin layer of air between 115a and the inner surface of the spherical shell. The size of the air bearing 115a determined by the total weight of the spherical vehicle is large enough to provide support to suspend the spherical vehicle when all the 14 air bearings are working at same time. The 14 air bearing assemblies are distributed around the outside of the spherical vehicle in such a way that the spherical vehicle may be suspended inside of the spherical shell to allow frictionless motions for the spherical vehicle.

While the embodiment in FIG. 9 shows the use of 14 air bearing assemblies, it will be understood by one of skill in the art that a small or a larger number of air bearing assemblies could also be used to support the spherical vehicle such as, for example, 12 air bearing assemblies located at the vertices of an icosahedron on which a spherical skeleton is based and in this case the three orthogonal ring beams described above located on the XOY, YOZ, and XOZ planes are still needed.

The four-ring-beam joint in FIG. 13d provides a supporting structure in the spherical skeleton with the strongest bending strength. There are six such four-ring-beam joints in the spherical skeleton. There are six driving assemblies and six restoring and damping assemblies. A typical driving assembly 117c and a typical restoring and damping assembly 116c are located close to a four-ring-beam joint shown in FIG. 15. Similarly, the other five driving assemblies and the other five restoring and damping assemblies are located close to the other five four-ring-beam joints, respectively. The six driving assemblies and the six restoring and damping assemblies are mounted on the three ring beams which are located in the XOY, XOZ, and YOZ planes, respectively. Therefore, these three ring beams are orthogonal to each other as shown in FIG. 13a.

Figure 15:
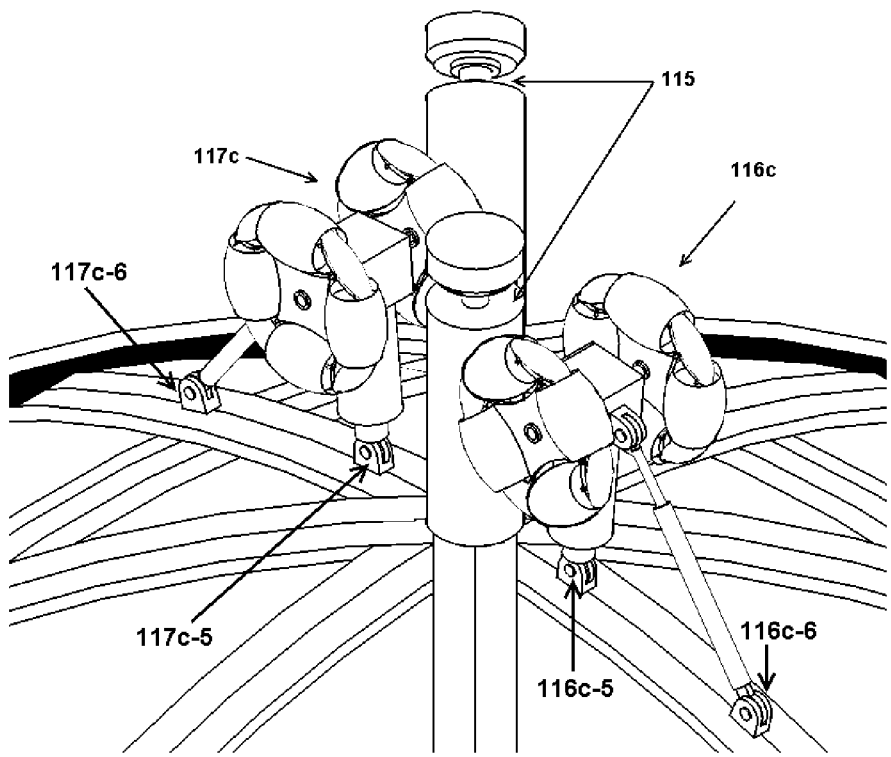
FIG. 15 is a zoom-in perspective view of the spherical skeleton with a driving assembly, a restoring and damping assembly, and two spike-type supports of air bearing assemblies.
Figure 16:
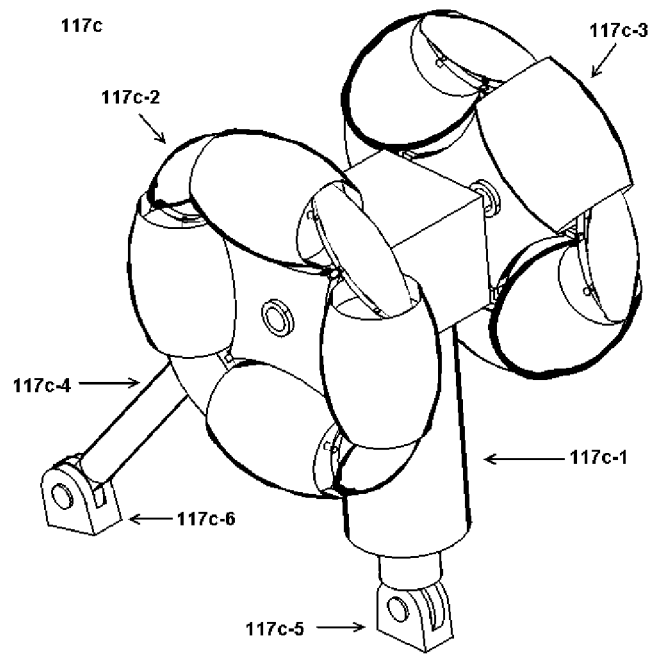
FIG. 16 is a perspective view of a driving assembly with a pair of omni wheels.

The driving assembly 117c includes an electrical right-angle DC motor 117c-1, a pinned support 117c-5 to restrict tangential and normal movements of the motor on a ring beam but to allow a rotational movement, two identical omni wheels 117c-2 and 117c-3 which are paired up and symmetrically located on each side of the right-angle DC motor as shown in FIG. 16 to provide power for rotational movements of the spherical vehicle, a linear actuator 117c-4 and a pinned support 117c-6 supporting 117c-4 on one end. The other end (not shown) of the linear actuator 117c-4 is connected to a pinned support (not shown) mounted on the outside surface of the square casing of the DC motor 117c-1 to control the rotation of the driving assembly 117c about the pinned support 117c-5 in order to contact and to detach the inner surface of the spherical shell. The pinned supports 117c-5 and 117c-6 are aligned with the centerline of the ring beam as shown in FIG. 15. The omni wheels are specially designed to have continuous alternate rollers (e.g. German patent DE822660) to allow smooth movements for the spherical vehicle. The rollers are made of material that provides excellent traction and control. Rotations (RPM) of the omni wheels are controlled by the DC motors. The normal force of the omni wheels on the inner surface of the spherical shell is controlled by the linear actuator 117c-4. The RPM of the omni wheels and the normal force of the omni wheels on the inner surface are adjustable to provide a desired moment on the spherical vehicle. The driving assemblies 117c and 117d shown in FIG. 10 are two identical driving units mounted on the ring beam which is in the XOZ plane. These two driving units are paired up and diametrically opposed to each other on the ring beam with the omni wheel rotation axes parallel to the pitch axis of the spherical vehicle as shown in FIG. 10 in order to provide pitch moments on the spherical vehicle. Other driving assemblies 117a and 117b (FIG. 11), 117e and 117f (FIG. 12) are mounted in structures in a similar way as that for 117c and 117d. More specifically, the driving assemblies 117a and 117b are paired up and mounted on the ring beam within the YOZ plane and in the orientation to provide roll moments on the spherical vehicle as shown in FIG. 11 while the driving assemblies 117e and 117f are paired up and mounted on the ring beam within the XOY plane and in the orientation to provide yaw moments on the spherical vehicle as shown in FIG. 12.

Figure 17:
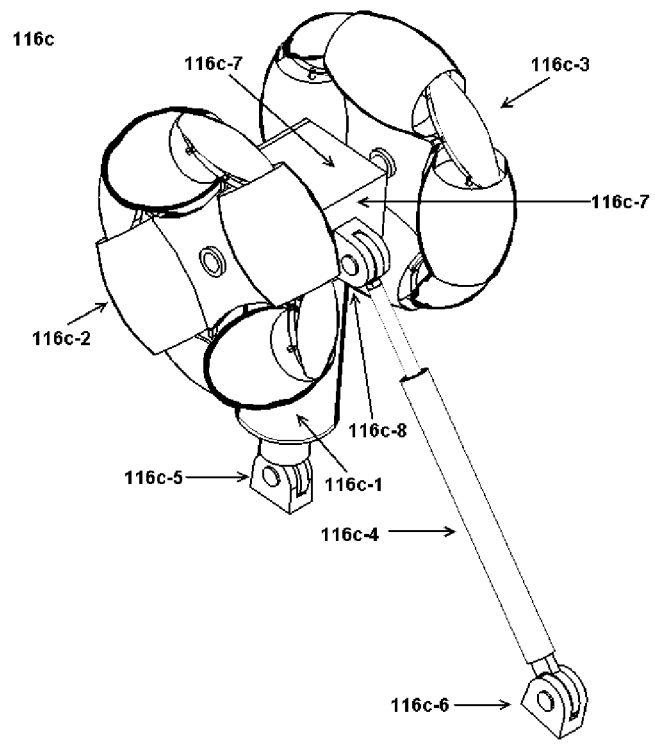
FIG. 17 is a perspective view of a restoring and damping assembly with a pair of omni wheels.

Referring to FIG. 17, the restoring and damping assembly 116c includes a cylindrical casing 116c-1, a square casing 116c-7, a pinned support 116c-5 to restrict tangential and normal movements of the assembly on a ring beam but to allow a rotational movement, two identical omni wheels 116c-2 and 116c-3 which are symmetrically located on each side of the square casing 116c-7 to provide restoring and damping power for rotational movements of the spherical vehicle, a linear actuator 116c-4, a pinned support 116c-6 supporting 116c-4, and a pinned support 116c-8. The pinned supports 116c-5 and 116c-6 are aligned with the centerline of the ring beam as shown in FIG. 15. The linear actuator 116c-4 is to control the rotation movement of the restoring and damping assembly 116c about the pinned support 116c-5 in order to contact the inner surface of the spherical shell. The omni wheels are connected to a rotational damper 131 (FIG. 19a) inside the square casing 116c-7 through a shaft 126 (FIG. 18) and are also connected to a machined rotational spring 128 (FIG. 19a) through bevel gears inside the square casing 116c-7 shown in FIG. 18. The restoring and damping assemblies 116c and 116d as shown in FIG. 10 are two identical assemblies and mounted on a ring beam which is in the XOZ plane. These two assemblies are paired up and diametrically opposed to each other on the ring beam with the omni wheel rotation axes parallel to the pitch axis of the spherical vehicle as shown in FIG. 10 in order to provide restoring and damping pitch moments on the spherical vehicle. Other restoring and damping assemblies 116a and 116b (FIG. 11), 116e and 116f (FIG. 12) are mounted in structures in a similar way as that for 116c and 116d. More specifically, the restoring and damping assemblies 116a and 116b are paired up and mounted on the ring beam within the YOZ plane and in the orientation to provide roll restoring and damping moments on the spherical vehicle as shown in FIG. 11 while the restoring and damping assemblies 116e and 116f are paired up and mounted on the ring beam within the XOY plane and in the orientation to provide yaw restoring and damping moments on the spherical vehicle as shown in FIG. 12. The restoring and damping assemblies 116a, 116b, 116c, 116d, 116e, and 116f contact the inner surface of the spherical shell at all the time during operation of the spherical vehicle. Therefore, the rotational movements of the omni wheels are passive subject to the rotational movements of the spherical vehicle, the rotational springs, and the rotational dampers. The omni wheels of the restoring and damping assemblies are identical with the omni wheels of the driving assemblies.

Figure 18:
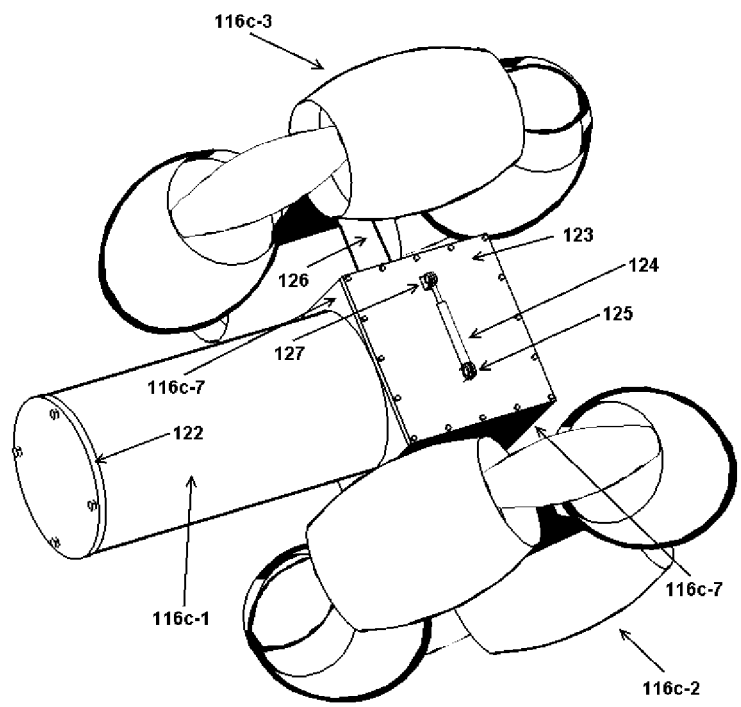
FIG. 18 is a perspective view of a restoring and damping assembly from an angle different with that in FIG. 17.
Figure 19A:
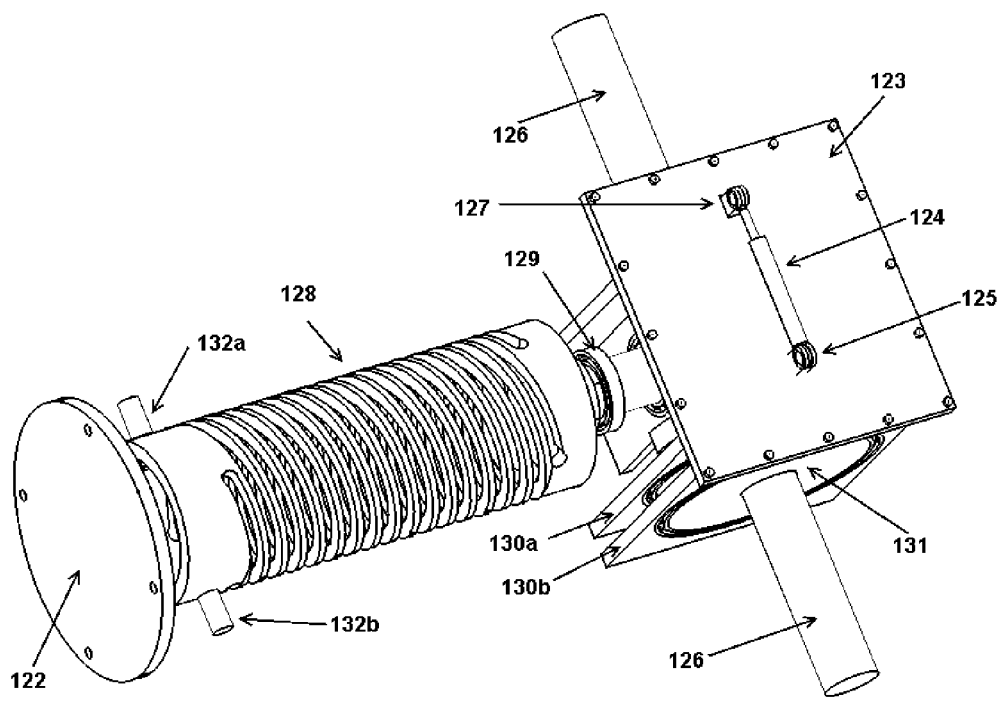
FIG. 19a is a perspective view of inside structures of a restoring and damping assembly shown in FIG. 18.
Figure 19B:
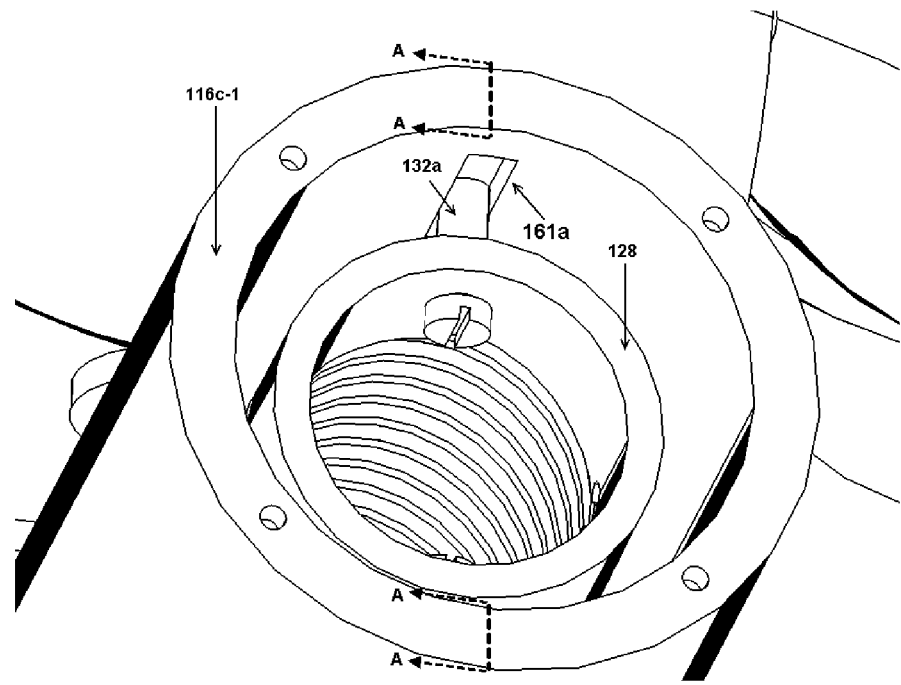
FIG. 19b is a perspective view of a restoring and damping assembly showing a spring mounting mechanism.
Figure 19C:
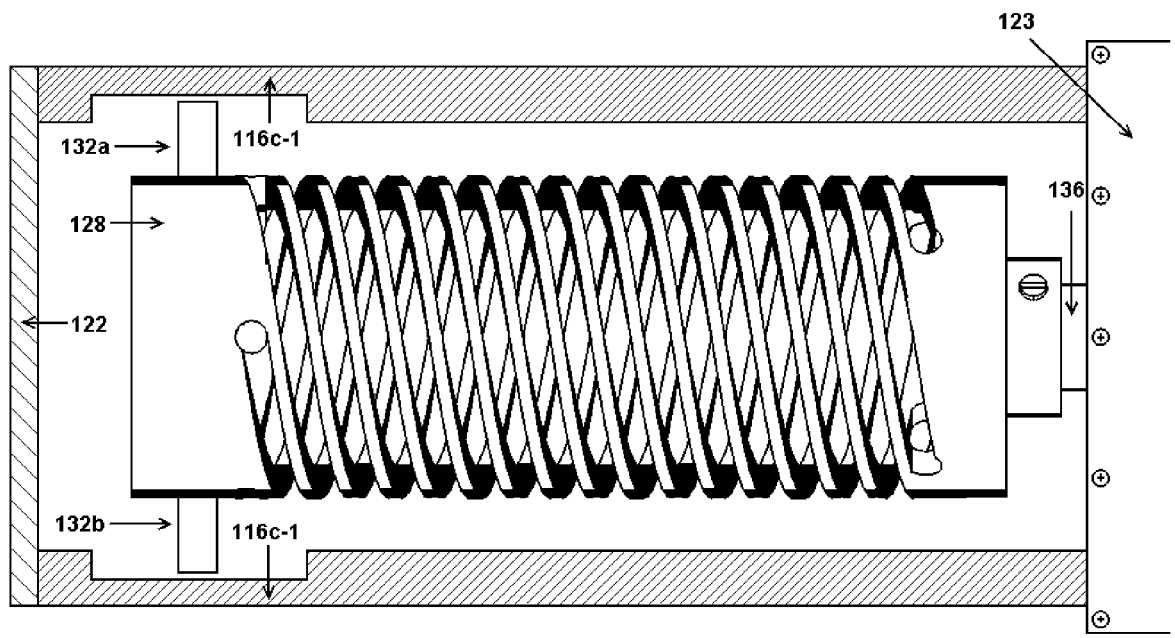
FIG. 19c is a section view of A-A plane in FIG. 19b to show details of the spring mounting mechanism for the restoring and damping assembly.
Figure 21A:
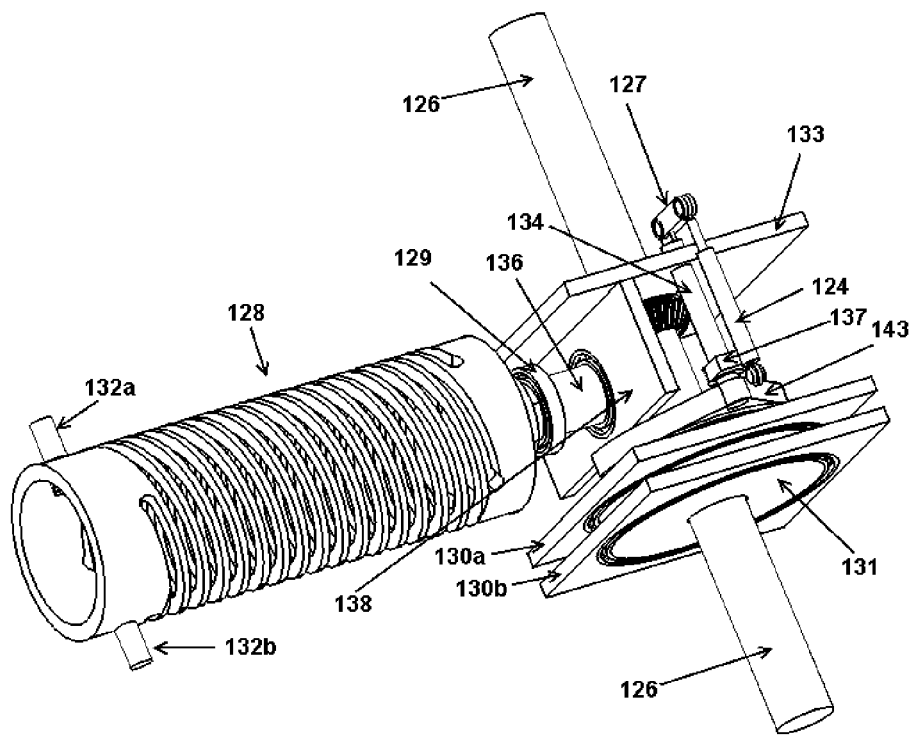
Figure 21B:
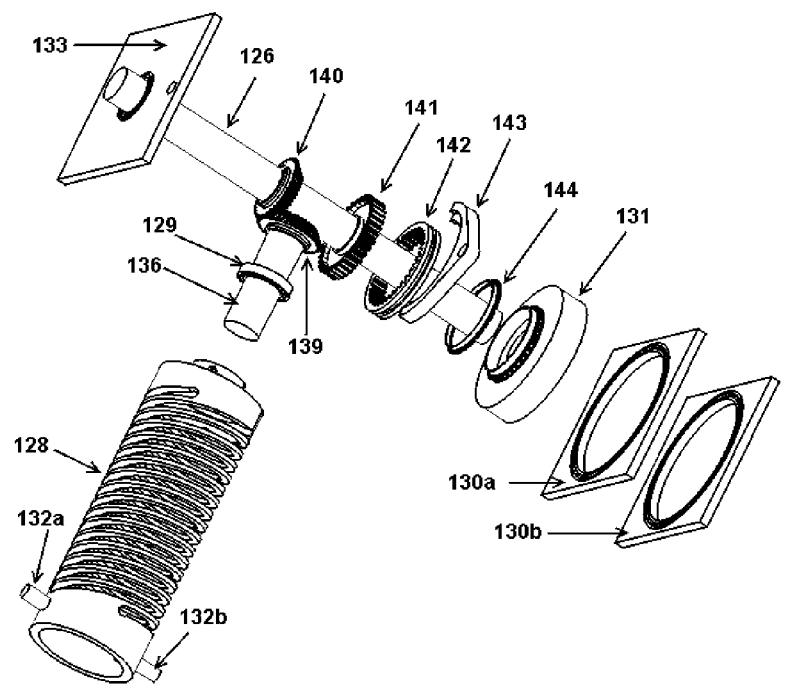
FIG. 21b is an exploded view of a restoring and damping assembly.

Referring to FIG. 18, the square casing 116c-7 has a circular opening connecting to the cylindrical casing 116c-1 and a lid 123 on which a linear actuator 124 is mounted. The cylindrical casing 116c-1 also has a lid 122. The rotational spring 128 is installed inside the cylindrical casing 116c-1 as shown in FIG. 19a and FIG. 19b. One end of 128 is connected to 116c-1 through two bolt mechanisms 132a and 132b which are smoothly slidable in slots 161a and 161b (not shown), respectively as shown in FIG. 19b and FIG. 19c. The two slots 161a and 161b (not shown) are diametrically opposed to each other and located longitudinally in the inside surface of 116c-1. The two slots 161a and 161b (not shown) are about half depth of the shell thickness of 116c-1 with certain length and width depending on the characteristics of the spring 128 to restrict the rotational motion of the spring 128 on this end but to release longitudinal stress created during rotational movements of the spring 128. A section view of A-A plane in FIG. 19b is given in FIG. 19c to show the detailed layout of the mechanism. Another end of the spring 128 is fastened to a shaft 136 as shown in FIG. 19c. The shaft 136 is fixed in place by a ball bearing 129 (FIG. 19a, FIG. 21a, and FIG. 21b) in a wall of the square casing 116c-7 (FIG. 18) and is connected to the shaft 126 by bevel gears 139 and 140 as shown in FIG. 21b to transfer the rotational motions between the shaft 126 and the shaft 136. Although straight bevel gear is demonstrated in FIGS. 21b and 21c, other bevel gears could be used, such as Zerol, spiral, or hypoid bevel gears. The two omni wheels are installed rigidly on the two ends of the shaft 126 as shown in FIG. 18. In such way, rotational kinetic energy of the omni wheels 116c-2 and 116c-3 (FIG. 18) is transferred to potential energy of the spring 128 (FIG. 19a, FIG. 21b) and vice versa.

Figure 20:
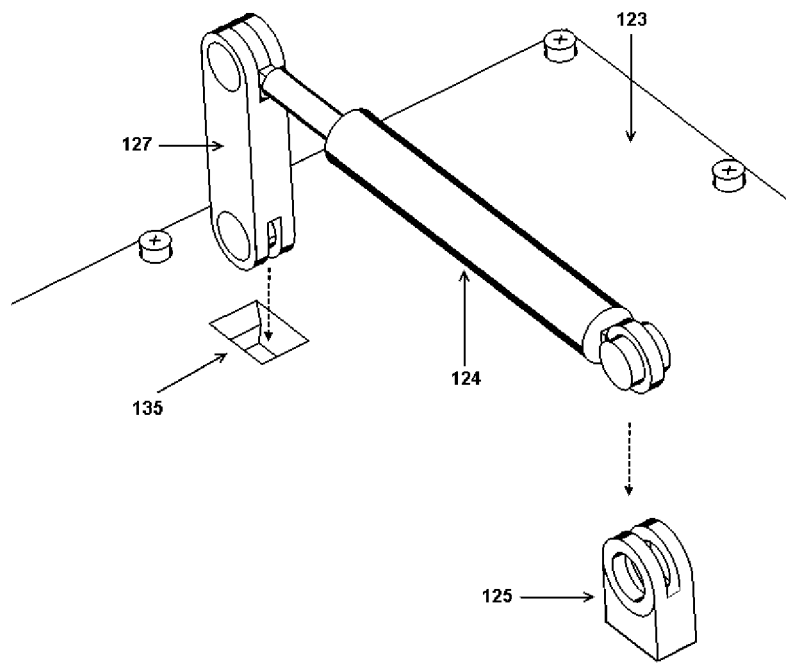
FIG. 20 is an exploded and zooming view of the restoring and damping assembly shown in FIG. 18.
Figure 21C:
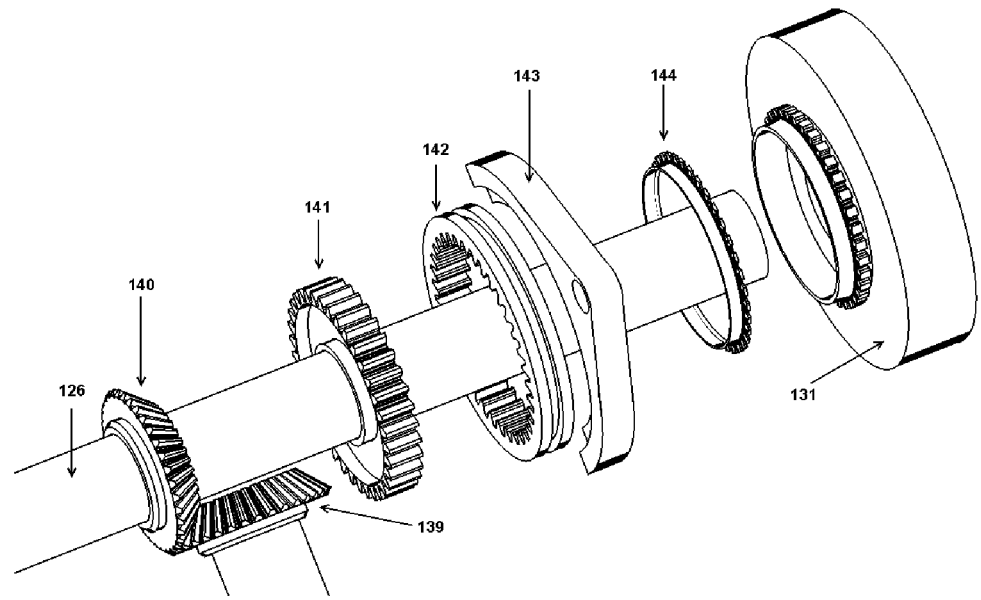
FIG. 21c is another exploded view showing a damping assembly.

The rotational damper 131 with a center hole which is larger than the shaft 126 and has a synchronizer cone teeth arrangement as shown in FIG. 21b and FIG. 21c. The damper 131 is supported by two larger radial ball bearings 130a and 130b so that it suspends over the shaft 126 as shown in FIG. 21a. As shown in FIG. 21b and FIG. 21c, a hub 141 is fixed to the shaft 126, and a sleeve 142 that is free to slide over the hub 141 is connected with a shift fork 143. A synchronizer ring 144 is located between the sleeve 142 and the damper 131 as shown in FIG. 21b and FIG. 21c. The shift fork 143 is fixed to a shift rod 134 (FIG. 21a) which is controlled by the linear actuator 124 through a connector 127. The shift rod 134 is slidable through two holes one of which is in a partition wall 133 (FIG. 21a and FIG. 21b) and another hole is in a ring support 137 (FIG. 21a) which is fixed on the inside surface (not shown) of the lid 123 (FIG. 20). There is a ball bearing in the partition wall 133 to support the shaft 126 (FIG. 21b). A partition wall 138 (FIG. 21a) with a ball bearing is used to support the shaft 136. The connector 127 as shown in FIG. 20 links the shift rod 134 (FIG. 21a) inside the square casing 116c-7 (FIG. 17) to the linear actuator 124 mounted on the outside surface of the lid 123 (FIG. 20) through a rectangular hole 135 on the lid 123 as shown in FIG. 20. Another end of the linear actuator 124 is connected to a pinned support 125 fixed on the outside surface of the lid 123 (FIG. 20). Therefore, when the linear actuator 124 moves the sleeve 142 to connect the hub 141 with the synchronizer cone teeth on the damper 131, a desired locking mechanism would be achieved and the damper 131 is engaged in the assembly. In another way around, the linear actuator 124 may move the sleeve 142 to disconnect the hub 141 with the damper 131 so that the damper is disengaged in the assembly. As shown in FIG. 20, there is a neck mechanism in the halfway through the hole 135 to serve as a support for the connector 127 to work efficiently in moving the shift rod 134 in both ways.

Figure 22A:
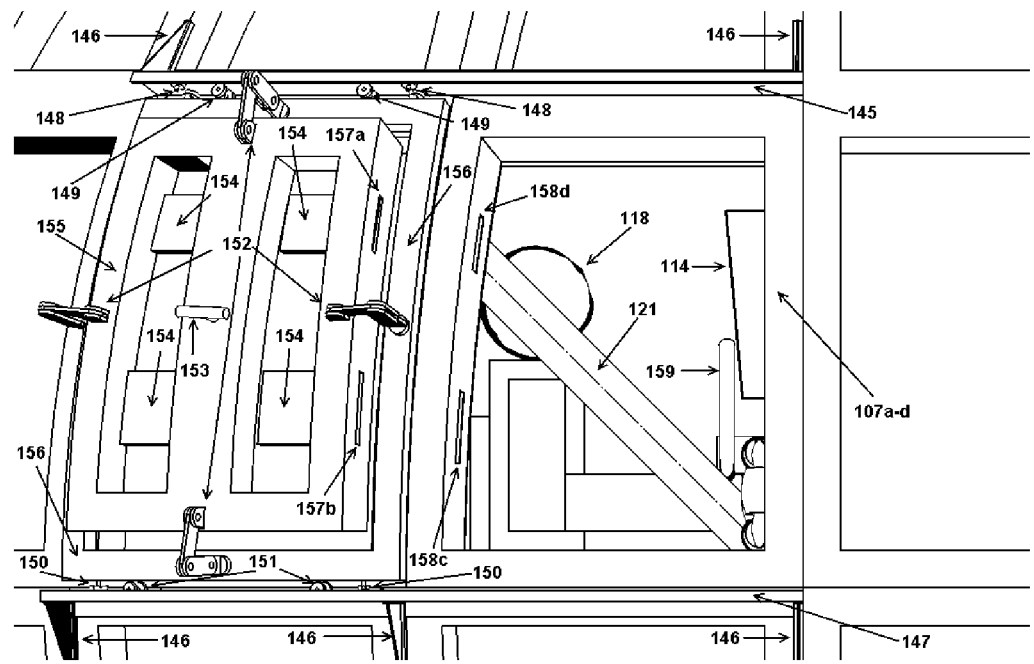
FIG. 22a is a perspective view of a door assembly with the door open.
Figure 22B:
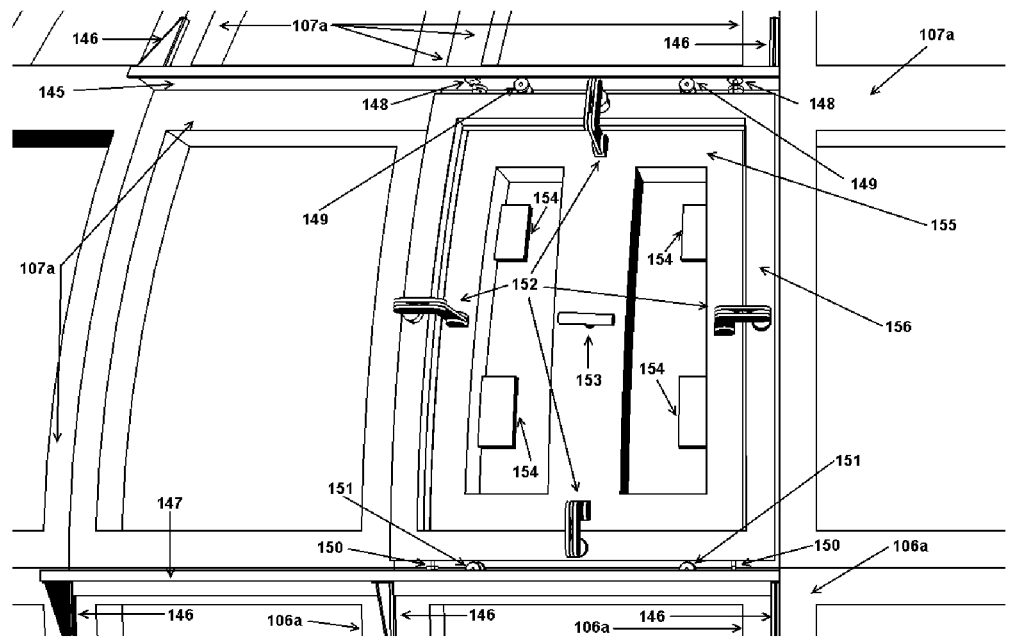
FIG. 22b is a perspective view of the door assembly with the door closed.
Figure 23A:
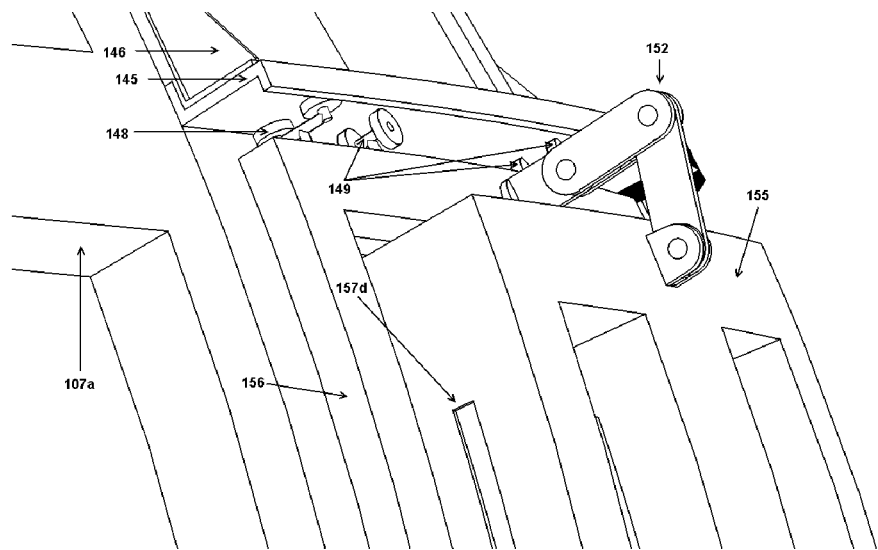
FIG. 23a is a perspective view of the top portion of the door assembly.
Figure 23B:
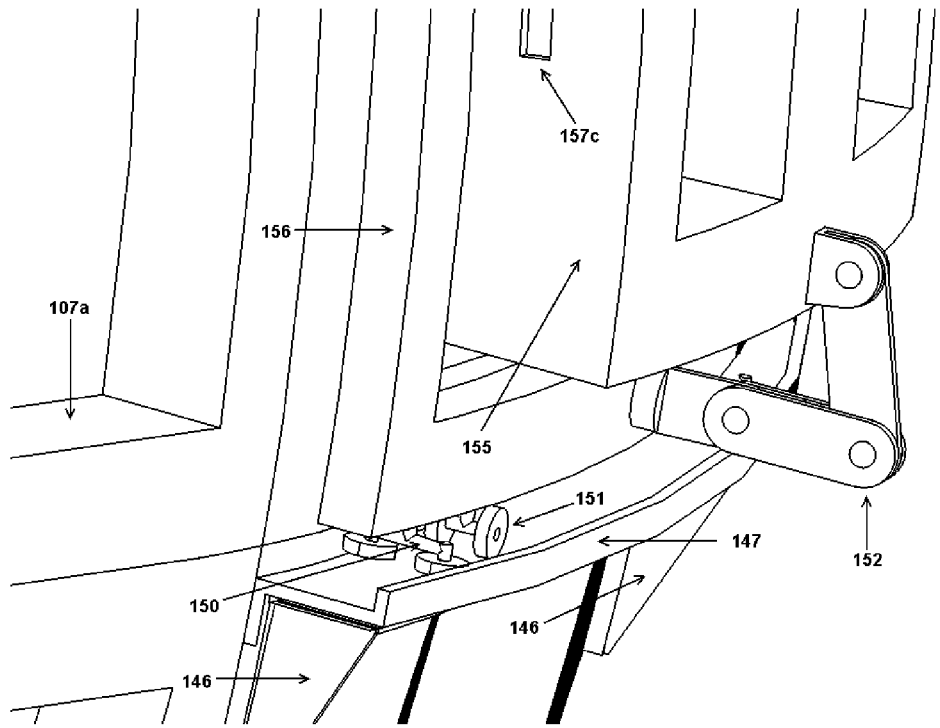
FIG. 23b is a perspective view of the bottom portion of the door assembly.

The door assembly 108 (FIG. 1) on the spherical shell is illustrated in FIG. 22a and FIG. 22b. The assembly 108 (FIG. 1) is capable to slide along a track bounded by a top track 145 and a bottom track 147 as shown in FIG. 22a. The top track 145 is mounted on an outside frames 107a (FIG. 22b) of the top half spherical shell 107 (FIG. 1) with two brackets 146 (FIG. 22b). The lower track 147 is mounted on an outside frames 106a (FIG. 22b) of the bottom spherical shell 106 (FIG. 1) with three brackets 146. There are two door frames in this assembly. One is the frame 107a-d (FIG. 22a) which is also an original frame of one bottom panel of the spherical shell 107 (FIG. 1) with the middle plate cut out as shown in FIG. 22a. Another frame is a sliding frame 156 which is holding a door panel 155 as shown in FIG. 22a. The sliding frame 156 and the door panel 155 are sliding together as one piece as shown in FIG. 22a. At least two sets of wheel assembly 149 (FIG. 23a) are mounted vertically at the top of the sliding frame 156 and at least two sets of wheel assembly 148 (only one set is shown in FIG. 23a) are mounted almost horizontally on the top of the sliding frame 156. Similarly, at least two sets of wheel assembly 151 (only one set is shown in FIG. 23b) are mounted vertically at the bottom of the sliding frame 156 and at least two sets of wheel assembly 150 (only one set is shown in FIG. 23b) are mounted horizontally on the bottom of the sliding frame 156 (FIG. 23b). At least four hinge assemblies 152 (FIG. 22a, FIG. 22b) are mounted on the four sides of the sliding frame 156, respectively to allow the door panel 155 to be opened and close easily as shown in FIG. 22a where the door panel 155 is opened and slides away with the sliding frame 156, and as shown in FIG. 22b where the door panel 155 is closed. There are four slots 157a, 157b, 157c (not shown), and 157d (not shown) on two vertical frame sides of the door panel 155 and there are four same size slots 158a (not shown), 158b (not shown), 158c, and 158d on the two vertical sides of the frame 107a-d as shown in FIG. 22a. Four flat door bolts 154 can be pushed into slot 158a, 158b, 158c, and 158d, respectively to lock the door panel 155 in place to form a perfect shell as shown in FIG. 22b. A door handle 153 (FIG. 22a and FIG. 22b) is located in the center of the door panel 155.

Figure 24:
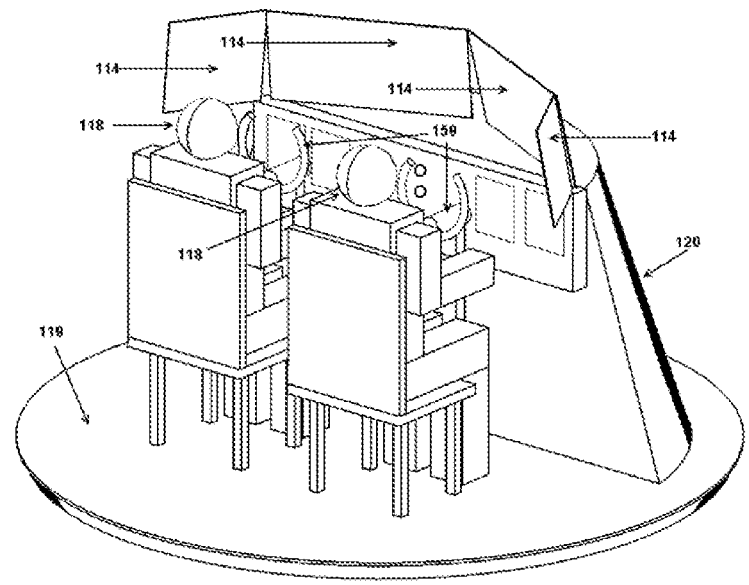
FIG. 24 is a perspective view of a pilot cabin of the simulator.

The platform 119 is fixed to the ring beams horizontally inside of the spherical skeleton as shown in FIG. 10 and FIG. 11. The pilot cabin on top of the platform 119 as shown in FIG. 24 includes the pilot models 118, the dashboard 120, the screens 114, control columns 159, and other necessary apparatuses (not shown) such as batteries, air compressors, computers etc. The mass distributions of all the apparatuses on board the spherical vehicle needs to be carefully designed and arranged to meet a certain requirement described below.

Due to space limitation of any motion simulators, translational motions (surge, sway, and heave) cannot be simulated 100%. For example heights and distances traveled by an aircraft or speeds of an aircraft in translational directions may not be able to be simulated. However, for a short period of time translational accelerations of a vehicle in surge, sway, and heave may be able to be simulated by moving the platform 103, the platform 102, and the piston 105 as shown in FIG. 1, respectively in order to apply desired inertial force effects on trainees on board the spherical vehicle 109. For rotational motions, there is no such space limitation in this invention which is able to simulate 100% rotational dynamics of vehicles including, but not limited to, aircrafts, automobiles, and ships. As we know it is the rotational motion characteristics that are the most crucial for the safety of these vehicles. To obtain valid results from this invention, the spherical vehicle must be designed and constructed in a special manner that will ensure that its rotational motions are identical with rotational motions that would be exhibited by a full scale vehicle. The spherical vehicle is not a geometrically scaled replica of the original vehicle, but a dynamically scaled model. For that purpose, a scaling factor needs to be determined first. The moments of inertias, the restoring coefficients, and the damping coefficients of the spherical vehicle and the driving moments acting on the spherical vehicle in this invention have to be at a same scale comparing with the counterparts (the original vehicle) to be simulated. More specifically, assume the rotational motions ($\varphi$, $\theta$, $\psi$) of the original vehicle, for example an aircraft, are governed by the following equations in the principal inertia axes reference frame.

$$I_x\ddot{\varphi}+b_1\dot{\varphi}+k_1\varphi=(I_y-I_z)\dot{\theta}\dot{\psi}+M_{11}(t), \quad \text{Math. 11}$$

$$I_y\ddot{\theta}+b_2\dot{\theta}+k_2\theta=(I_z-I_x)\dot{\varphi}\dot{\psi}+M_{21}(t), \quad \text{Math. 12}$$

$$I_z\ddot{\psi}+b_3\dot{\psi}+k_3\psi=(I_x-I_y)\dot{\varphi}\dot{\theta}+M_{31}(t), \quad \text{Math. 13}$$

wherein, $I_x$, $I_y$, and $I_z$ are the moment of inertias of the original vehicle about the principal axes of X, Y and Z, respectively, $b_1$, $b_2$, and $b_3$ are the damping coefficients for roll, pitch, and yaw, respectively, $k_1$, $k_2$ and $k_3$ are the restoring coefficients for roll, pitch, and yaw, respectively, $M_{11}$, $M_{21}$, and $M_{31}$ are the external moments along the roll, pitch, and yaw directions, respectively. In order to have dynamic equivalence between the full scale original vehicle and the spherical vehicle (or called subscale model) in this invention, let us multiply a constant scaling factor A to the above equations, we obtain.

$$\lambda I_x\ddot{\varphi}+\lambda b_1\dot{\varphi}+\lambda k_1\varphi=(\lambda I_y-\lambda I_z)\dot{\theta}\dot{\psi}+\lambda M_{11}(t), \quad \text{Math. 14}$$

$$\lambda I_y\ddot{\theta}+\lambda b_2\dot{\theta}+\lambda k_2\theta=(\lambda I_z-\lambda I_x)\dot{\varphi}\dot{\psi}+\lambda M_{21}(t), \quad \text{Math. 15}$$

$$\lambda I_z\ddot{\psi}+\lambda b_3\dot{\psi}+\lambda k_3\psi=(\lambda I_y-\lambda I_x)\dot{\varphi}\dot{\theta}+\lambda M_{31}(t), \quad \text{Math. 16}$$

The spherical vehicle in this invention is designed to have moments of inertia about the principal inertia axes X, Y, and Z as $\lambda I_x$, $\lambda I_y$, and $\lambda I_z$, respectively; the damping coefficients in roll, pitch, and yaw directions as $\lambda b_1$, $\lambda b_2$, and $\lambda b_3$, respectively; the restoring coefficients in roll, pitch, and yaw directions as, $\lambda k_1$, $\lambda k_2$, and $\lambda k_3$ respectively; and the moments acting in roll, pitch, and yaw directions as $\lambda M_{11}$, $\lambda M_{21}$, and $\lambda M_{31}$, respectively. In summary, all these parameters are simply decreased in a same scale from that of the original values. The center of gravity of the spherical vehicle coincides with the geometric center of the spherical shell. Therefore the rotational motion dynamics of the full scale original vehicle would be identical with that of the spherical vehicle designed according to the above requirements because the governing equations Math. 11, Math. 12, and Math. 13 of the former are actually identical with the governing equations Math. 14, Math. 15, and Math. 16 of the latter. The scaling factor A could be ranging from very small, say 0.0001, for a very heavy vehicle to about 1 for a small vehicle or even larger than 1 for tinny vehicle depending on applications.

For a ship application, the moments of inertias $I_x$, $I_y$, and $I_z$ should include the added mass effects and the yaw restoring coefficient $k_3$ should be set to zero. Therefore the dynamics of the simulator would be conservative in terms of the nonlinear instability threshold value comparing with that of the original full scale ship.

A plurality of ventilation ports, i.e. small holes (not shown) may be provided on a top portion of the top half spherical shell 107 to permit air circulation for occupants of the simulator if necessary.

Figure 25:
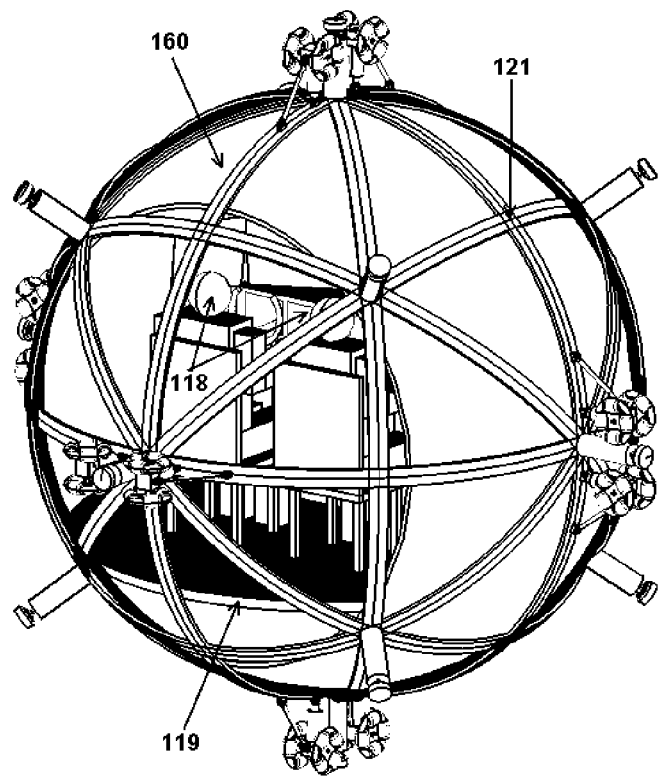
FIG. 25 is a perspective view of the spherical skeleton with a shell type screen for visualization.

In another embodiment, a shell screen 160 may be mounted on the inside of the spherical skeleton 121 as shown in FIG. 25 to replace the screens 114 (FIG. 9) for showing the virtual reality view of simulations. In this case, the screen 114 may be replaced by transparent glasses.

In yet another embodiment, the air bearing assemblies 115 (FIG. 9 and FIG. 14) may be replaced by omni-directional ball bearing assembly 170 as shown in FIG. 26a and FIG. 26b. In this case, on board air compressors are not needed.

In an alternative embodiment, the platform 112 (FIG. 5) is mounted to a ground of a room that houses the simulator. This embodiment shows the version of the simulator that gives up three translational motions in exchange for a simpler design.

It should be understood that the detailed description and specific examples, while indicating the preferred embodiment, are intended for purposes of illustration only and it should be understood that it may be embodied in a large variety of forms different from the one specifically shown and described without departing from the scope and spirit of the invention. This motion simulator in this invention can be as small or as large as is necessary for applications. It should be also understood that the invention is not limited to the specific features shown, but that the means and construction herein disclosed comprise a preferred form of putting the invention into effect, and the invention therefore claimed in any of its forms of modifications within the legitimate and valid scope of the appended claims.

What is claimed is:

1. A motion simulating device comprising:
   a. a spherical shell with a smooth inner surface mounted on the ground;
   b. a spherical vehicle suspending within said spherical shell, wherein said spherical vehicle including a plurality of ring beams for forming a base truss of said spherical vehicle;
   c. a plurality of bearing assemblies located around an exterior of said ring beams for suspending said spherical vehicle within said spherical shell, wherein each bearing assembly includes a bearing and a support post which is connected on one end to said exterior of said ring beams and on an other end to said bearing;
   d. a plurality of driving assemblies located around said exterior of said ring beams for rotationally driving said vehicle with respect to roll, pitch, and yaw axes of said vehicle, wherein each driving assembly includes motor-driven omni wheels and a linear actuator;
   e. a plurality of restoring assemblies located around said exterior of said ring beams for rotationally restoring positions of said vehicle with respect to said vehicle's roll, pitch, and yaw axes, wherein each restoring assembly includes restoring omni wheels, a rotational spring, and a linear actuator;
   f. a plurality of damping assemblies connectable to said restoring omni wheels for damping said vehicle's motions with respect to said vehicle's roll, pitch, and yaw axes, wherein each damping assembly includes a rotational damper and a shift gear mechanism controlled by a linear actuator for engaging and disengaging said damper; and
   g. a simulating pilot cabin mounted within said spherical vehicle.

2. The motion simulating device of claim 1 further comprising a means for controlling said linear actuators to adjust the normal forces between said omni wheels and said smooth inner surface of said spherical shell.

3. The motion simulating device of claim 1 wherein said bearings comprise air bearings and at least one air compressor.

4. The motion simulating device of claim 1 wherein said bearings comprise omni-directional ball bearings.

5. The motion simulating device of claim 1 further comprising a shell screen mounted on an inside of said ring beams for visual simulation purpose.

6. A motion simulating device comprising:
   a. a spherical shell which has a smooth inner surface and mounted on three controllable translational motion platforms;
   b. a spherical vehicle suspending within said spherical shell, wherein said spherical vehicle including a plurality of ring beams for forming a base truss of said spherical vehicle;
   c. a plurality of bearing assemblies located around an exterior of said ring beams for suspending said spherical vehicle within said spherical shell, wherein each bearing assembly includes a bearing and a support post which is connected on one end to said exterior of said ring beams and on an other end to said bearing;
   d. a plurality of driving assemblies located around said exterior of said ring beams for rotationally driving said vehicle with respect to roll, pitch, and yaw axes of said vehicle, wherein each driving assembly includes motor-driven omni wheels and a linear actuator;
   e. a plurality of restoring assemblies located around said exterior of said ring beams for rotationally restoring positions of said vehicle with respect to said vehicle's roll, pitch, and yaw axes, wherein each restoring assembly includes restoring omni wheels, a rotational spring, and a linear actuator;
   f. a plurality of damping assemblies connectable to said restoring omni wheels for damping said vehicle's motions with respect to said vehicle's roll, pitch, and yaw axes, wherein each damping assembly includes a rotational damper and a shift gear mechanism controlled by a linear actuator for engaging and disengaging said damper; and
   g. a simulating pilot cabin mounted within said spherical vehicle.

7. The motion simulating device of claim 6 further comprising a means for controlling said linear actuators to adjust the normal forces of between said omni wheels and said smooth inner surface of said spherical shell.

8. The motion simulating device of claim 6 wherein said bearings comprise air bearings and at least one air compressor.

9. The motion simulating device of claim 6 wherein said bearings comprise omni-directional ball bearings.

10. The motion simulating device of claim 6 further comprising a shell screen mounted on an inside of said ring beams for visual simulation purpose.

* * * * *

UNITED STATES PATENT AND TRADEMARK OFFICE
CERTIFICATE OF CORRECTION

PATENT NO. : 10,839,709 B2  Page 1 of 2
APPLICATION NO. : 16/153925
DATED : November 17, 2020
INVENTOR(S) : Shaojie Tang It is certified that error appears in the above-identified patent and that said Letters Patent is hereby corrected as shown below:

In the Specification

BACKGROUND: Column 1, Line 26, "28%" to read as "28°".

BACKGROUND: Column 1, Line 26, "34%" to read as "34°".

BACKGROUND: Column 1, Line 26, "36%" to read as "36°".

BACKGROUND: Column 1, Line 26, "50%" to read as "50°".

BACKGROUND: Column 2, Line 66, "$-\vec{\omega} \times \underline{H}$" to read as "$-\vec{\omega} \times \vec{H}$".

BACKGROUND: Column 3, Line 57, Math 3, "$(I_y - I_z)\dot{\theta}\psi$," to read as "$(I_y - I_z)\dot{\theta}\dot{\psi}$,".

BACKGROUND: Column 3, Line 61, Math 5, "$I_z\ddot{\psi}b_3\dot{\psi}$" to read as "$I_z\ddot{\psi} + b_3\dot{\psi}$".

BACKGROUND: Column 4, Line 11, Math 8, "$I_z\ddot{\psi}b_3\dot{\psi}$" to read as "$I_z\ddot{\psi} + b_3\dot{\psi}$".

BACKGROUND: Column 4, Line 45, Math 10, "$|\omega_{10} + \omega_{30}|$" to read as "$|\omega_{10} - \omega_{30}|$".

SUMMARY: Column 6, Line 38, "panel" to read as "panels".

SUMMARY: Column 7, Line 10, "bearing" to read as "bearings".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,839,709 B2

DETAILED DESCRIPTION: Column 15, Line 23, Math 13, "$(I_y - I_y)\dot{\varphi}\dot{\theta}$" to read as "$(I_x - I_y)\dot{\varphi}\dot{\theta}$".

DETAILED DESCRIPTION: Column 15, Line 34, "factor A" to read as "factor $\lambda$".

DETAILED DESCRIPTION: Column 15, Line 40, Math 16, "$(\lambda I_y - \lambda I_y)\dot{\varphi}\dot{\theta}$" to read as "$(\lambda I_x - \lambda I_y)\dot{\varphi}\dot{\theta}$".

DETAILED DESCRIPTION: Column 15, Line 58, "factor A" to read as "factor $\lambda$".